(12) United States Patent
Uzoh et al.

(10) Patent No.: US 9,397,038 B1
(45) Date of Patent: Jul. 19, 2016

(54) MICROELECTRONIC COMPONENTS WITH FEATURES WRAPPING AROUND PROTRUSIONS OF CONDUCTIVE VIAS PROTRUDING FROM THROUGH-HOLES PASSING THROUGH SUBSTRATES

(71) Applicant: Invensas Corporation, San Jose, CA (US)

(72) Inventors: Cyprian Emeka Uzoh, San Jose, CA (US); Charles G. Woychik, San Jose, CA (US); Arkalgud R. Sitaram, Cupertino, CA (US); Hong Shen, Palo Alto, CA (US); Zhuowen Sun, Campbell, CA (US); Liang Wang, Milpitas, CA (US); Guilian Gao, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/633,746

(22) Filed: Feb. 27, 2015

(51) Int. Cl.
| | | |
|---|---|---|
| H01L 21/44 | (2006.01) | |
| H01L 23/04 | (2006.01) | |
| H01L 23/52 | (2006.01) | |
| H01L 23/522 | (2006.01) | |
| H01L 49/02 | (2006.01) | |
| H01L 21/768 | (2006.01) | |

(52) U.S. Cl.
CPC ...... *H01L 23/5223* (2013.01); *H01L 21/76802* (2013.01); *H01L 21/76877* (2013.01); *H01L 23/5226* (2013.01); *H01L 28/60* (2013.01)

(58) Field of Classification Search
CPC .......... H01L 2924/01079; H01L 2924/01078; H01L 2924/01029; H01L 23/5226; H01L 21/76877; H01L 21/76843; H01L 21/76808; H01L 21/76807; H01L 21/76831; H01L 21/76898; H01L 21/7684; H01L 21/76879
USPC .................. 257/698, 750, 774, 775; 438/629, 438/638–640, 667, 672, 675
See application file for complete search history.

(56) References Cited

U.S. PATENT DOCUMENTS

| | | |
|---|---|---|
| 3,894,872 A | 7/1975 | Mitchell, Jr. et al. |
| 5,599,744 A | 2/1997 | Koh et al. |
| 6,259,128 B1 | 7/2001 | Adler et al. |
| 6,498,381 B2 | 12/2002 | Halahan et al. |
| 6,559,499 B1 | 5/2003 | Alers et al. |
| 6,847,077 B2 | 1/2005 | Thomas et al. |
| 7,510,928 B2 | 3/2009 | Savastiouk et al. |
| 7,557,037 B2* | 7/2009 | Sunohara .......... H01L 21/76898 257/E21.597 |
| 7,793,414 B2 | 9/2010 | Haba et al. |
| 7,839,622 B2 | 11/2010 | Matters-Kammerer |
| 7,851,321 B2 | 12/2010 | Clevenger et al. |
| 7,897,454 B2 | 3/2011 | Wang et al. |
| 8,085,524 B2 | 12/2011 | Roozeboom et al. |

(Continued)

OTHER PUBLICATIONS

U.S. Appl. No. 14/214,365, filed Mar. 14, 2014.

(Continued)

*Primary Examiner* — Hsien Ming Lee
(74) *Attorney, Agent, or Firm* — Haynes and Boone, LLP

(57) ABSTRACT

In a microelectronic component having conductive vias (114) passing through a substrate (104) and protruding above the substrate, conductive features (120E.A, 120E.B) are provided above the substrate that wrap around the conductive vias' protrusions (114') to form capacitors, electromagnetic shields, and possibly other elements. Other features and embodiments are also provided.

25 Claims, 17 Drawing Sheets

(56) References Cited

U.S. PATENT DOCUMENTS

| | | | |
|---|---|---|---|
| 8,110,862 | B2 | 2/2012 | Cheng et al. |
| 8,283,750 | B2 | 10/2012 | Guiraud et al. |
| 8,294,240 | B2 | 10/2012 | Nowak et al. |
| 8,298,906 | B2 | 10/2012 | Bernstein et al. |
| 8,298,944 | B1 | 10/2012 | West |
| 8,373,252 | B1 | 2/2013 | DeBaets |
| 8,552,485 | B2 | 10/2013 | Chang et al. |
| 8,558,345 | B2 | 10/2013 | Kim et al. |
| 8,575,760 | B2 * | 11/2013 | Phee et al. ............ 257/774 |
| 8,618,651 | B1 | 12/2013 | Yee |
| 8,673,775 | B2 | 3/2014 | Chiou et al. |
| 8,697,567 | B2 | 4/2014 | Henderson et al. |
| 8,748,284 | B2 | 6/2014 | Tzeng et al. |
| 8,785,289 | B2 | 7/2014 | Kim et al. |
| 8,802,494 | B2 | 8/2014 | Lee et al. |
| 8,841,185 | B2 | 9/2014 | Khakifirooz et al. |
| 8,890,316 | B2 | 11/2014 | Henderson et al. |
| 8,895,385 | B2 | 11/2014 | Chang et al. |
| 2006/0097378 | A1 * | 5/2006 | Yamano ............ 257/698 |
| 2006/0231900 | A1 | 10/2006 | Lee et al. |
| 2007/0117337 | A1 | 5/2007 | Chen et al. |
| 2007/0212845 | A1 | 9/2007 | Lin et al. |
| 2008/0019077 | A1 | 1/2008 | Coolbaugh et al. |
| 2008/0089007 | A1 | 4/2008 | Oladeji et al. |
| 2008/0113505 | A1 | 5/2008 | Sparks et al. |
| 2010/0019349 | A1 | 1/2010 | Oladeji et al. |
| 2010/0164062 | A1 | 7/2010 | Wang et al. |
| 2010/0244189 | A1 | 9/2010 | Klootwijk et al. |
| 2010/0316911 | A1 | 12/2010 | Tesson et al. |
| 2011/0291166 | A1 | 12/2011 | Booth, Jr. et al. |
| 2011/0291263 | A1 | 12/2011 | West |
| 2013/0161825 | A1 | 6/2013 | Hsu et al. |
| 2014/0036454 | A1 | 2/2014 | Caskey et al. |
| 2014/0061855 | A1 | 3/2014 | Kuo et al. |
| 2014/0124943 | A1 | 5/2014 | Behrends et al. |
| 2014/0127875 | A1 | 5/2014 | Behrends et al. |
| 2014/0138142 | A1 | 5/2014 | Hu et al. |
| 2014/0162449 | A1 * | 6/2014 | An et al. ............ 438/613 |
| 2014/0332980 | A1 | 11/2014 | Sanders et al. |

OTHER PUBLICATIONS

U.S. Appl. No. 14/304,535, filed Jun. 13, 2014.

N.H. Khan et al., "Power Delivery Design for 3-D ICs Using Different Through-Silicon Via (TSV) Technologies", IEEE Transactions on Very Large Scale Integration (VLSI) Systems, vol. 19, No. 4, Apr. 2011.

Non-Final Office Action mailed Nov. 8, 2010 in U.S. Appl. No. 12/480,694.

S. Köse et al., "Distributed Power Network Co-Design with On-Chip Power Supplies and Decoupling Capacitors", 13$^{th}$ International Workshop on System Level Interconnect Prediction (SLIP), 2011 (Retrieved from http://ieeexplore.ieee.org/xpl/login.jsp?tp=&arnumber=6135434&url=http%3A%2F%2Fieeexplore.ieee.org%2Fiel5%2F6125889%2F6135427%2F06135434.pdf%3Farnumber%3D6135434).

F. Roozeboom et al., "High-Density, Low-Loss MOS Capacitors for Integrated RF Decoupling", The International Journal of Microcircuits and Electronic Packaging, vol. 24, No. 3, Third Quarter, 2001.

* cited by examiner

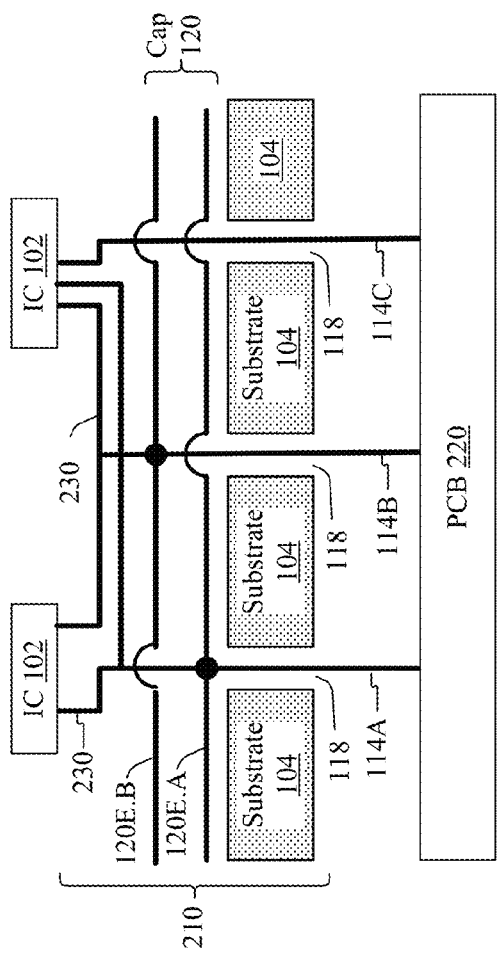
FIG. 2A PRIOR ART
FIG. 2B PRIOR ART
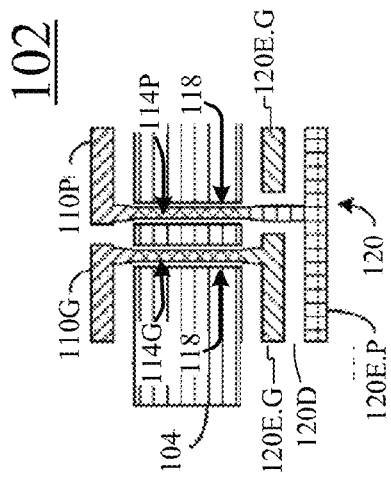
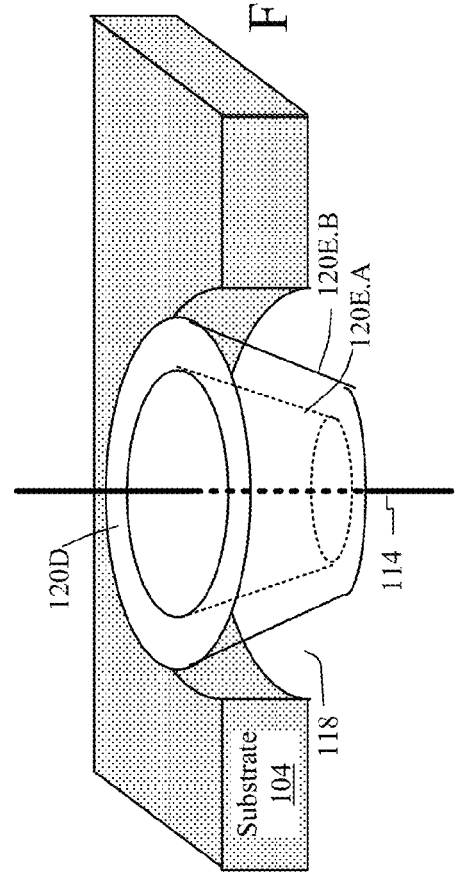
FIG. 3 PRIOR ART

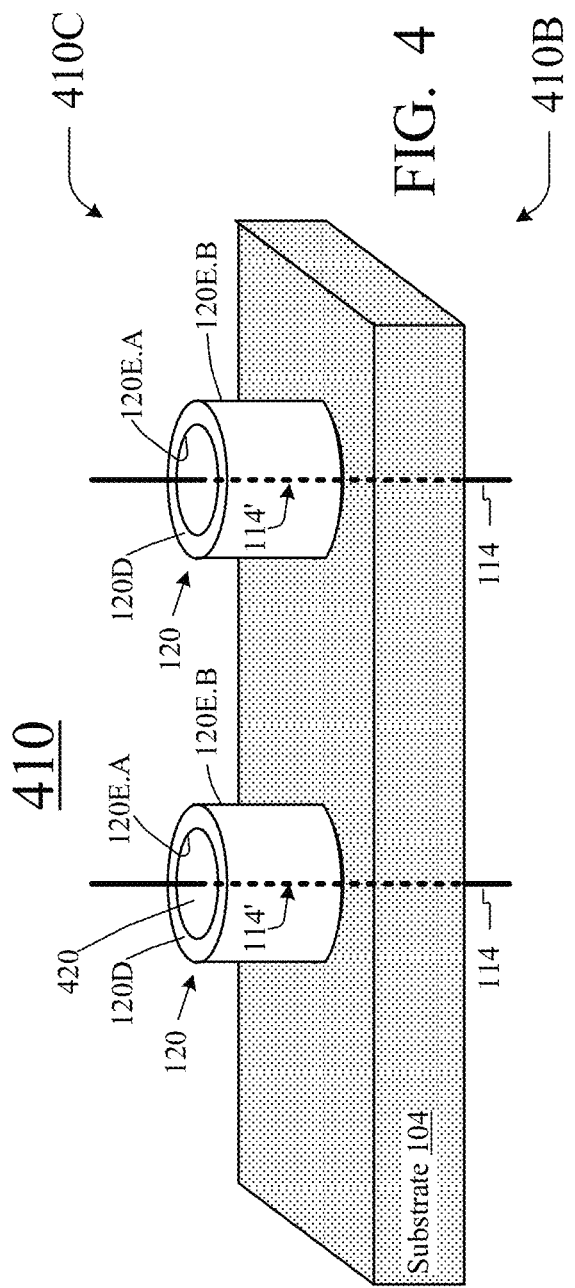

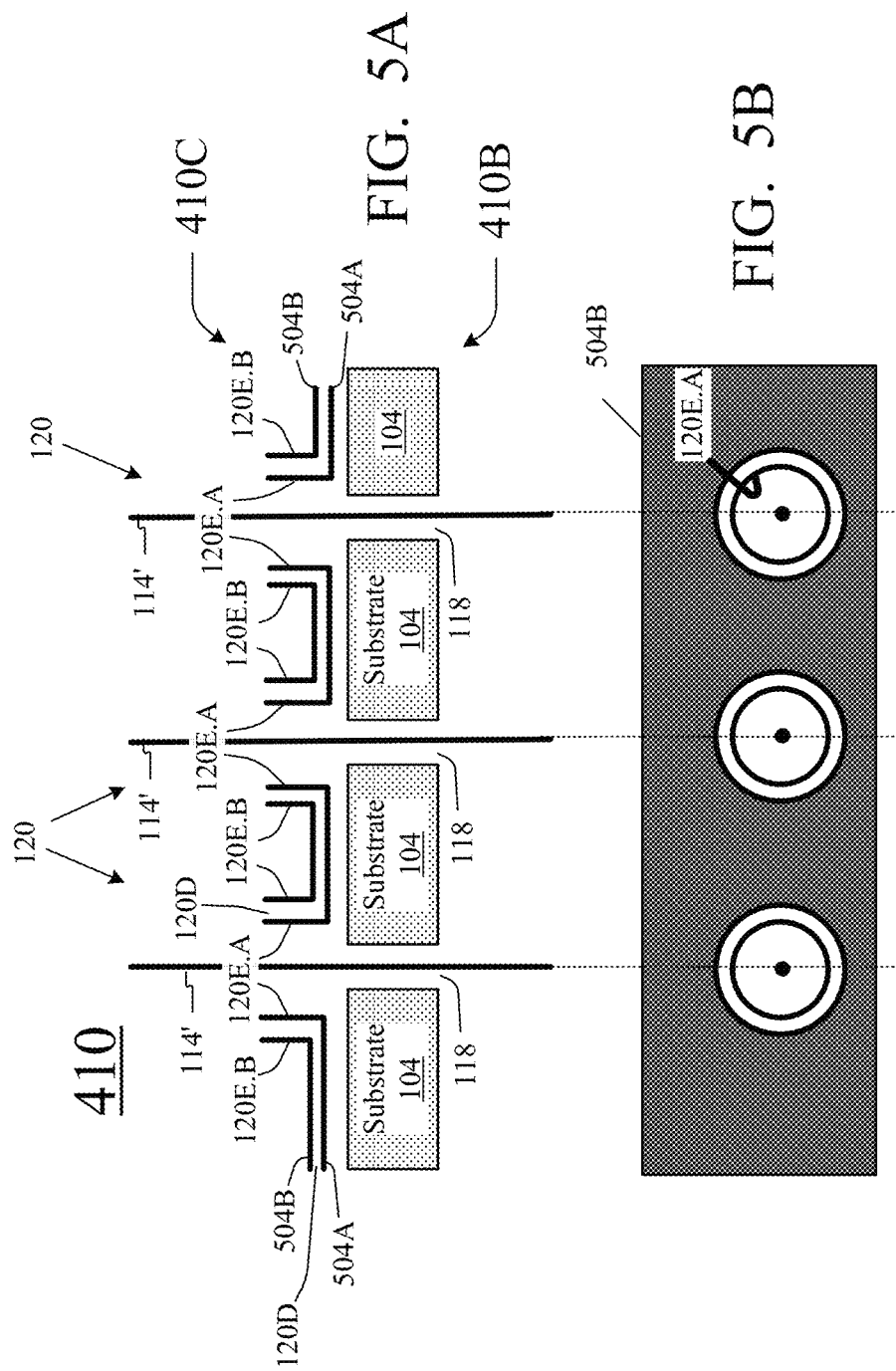

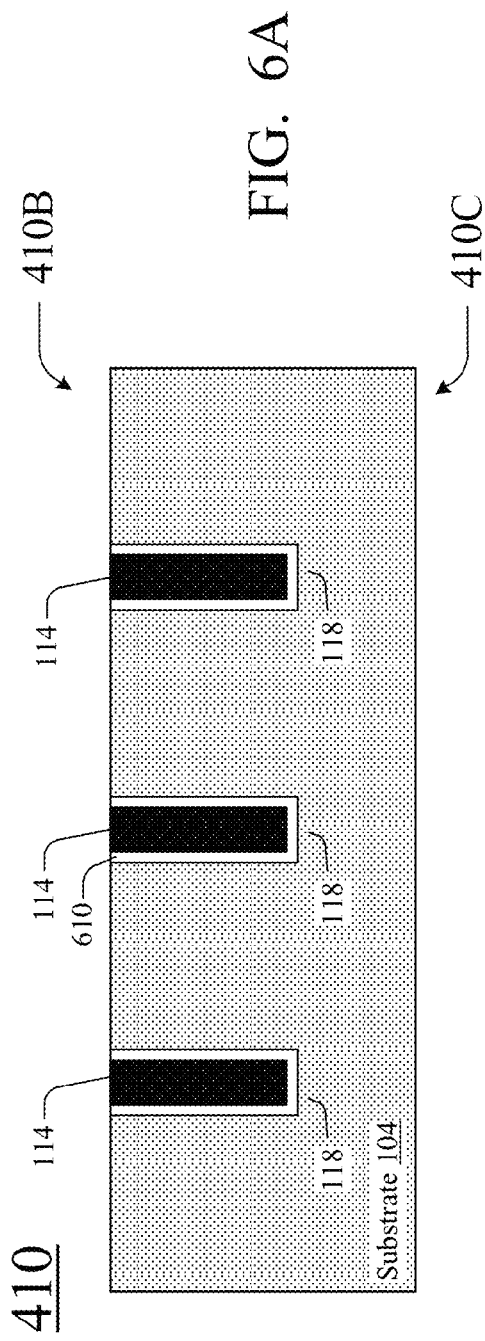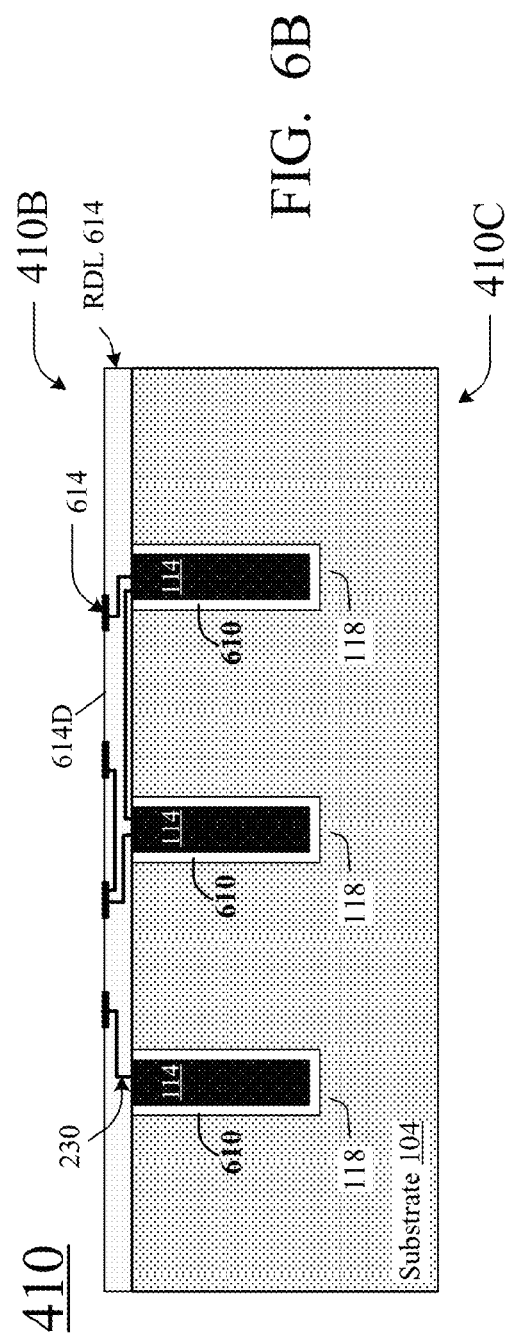

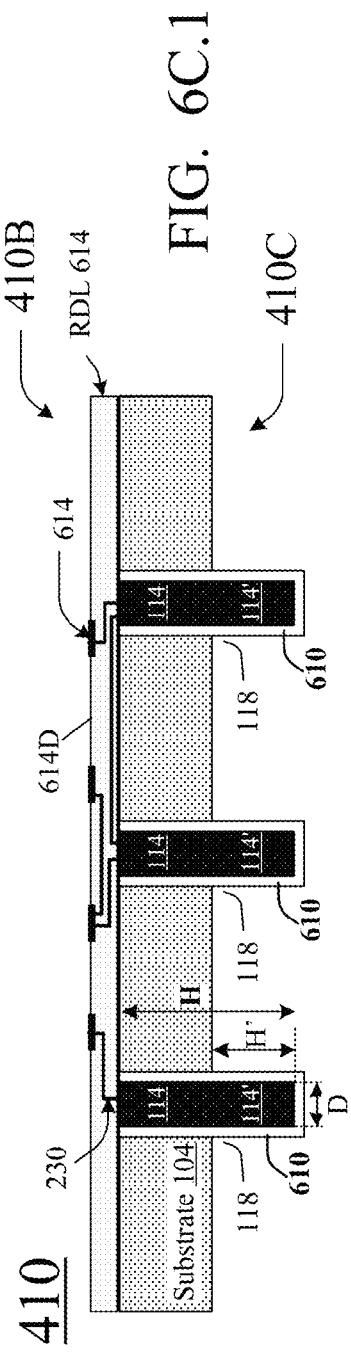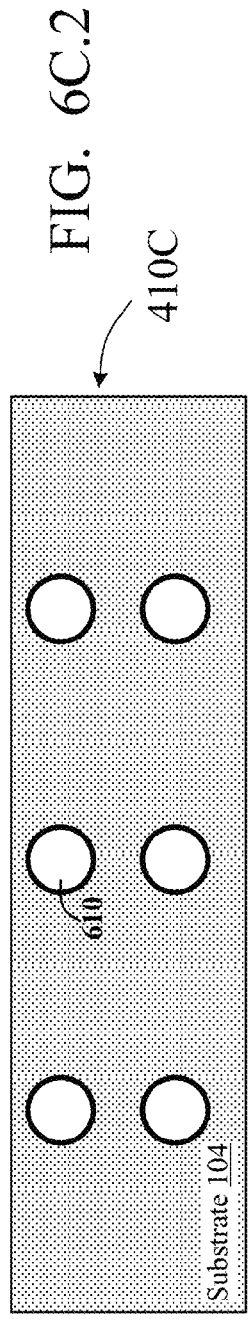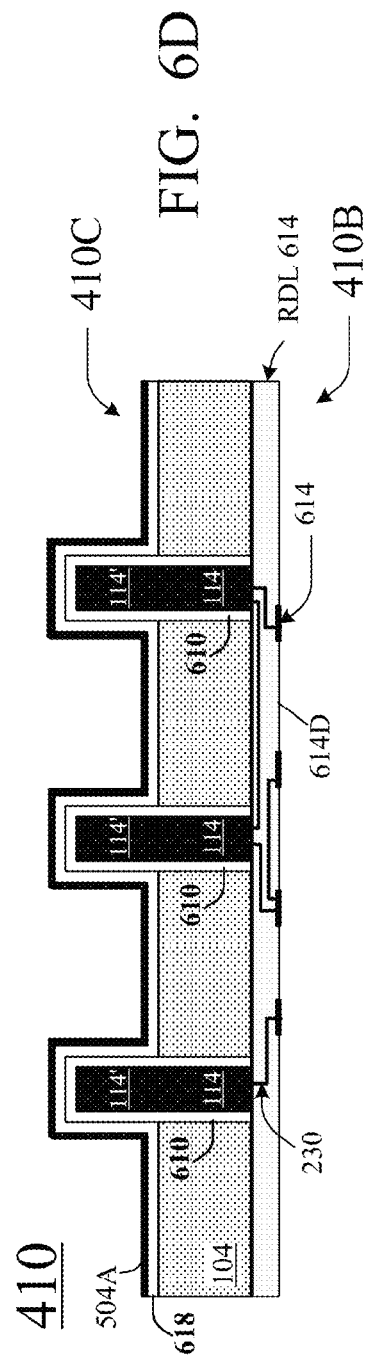

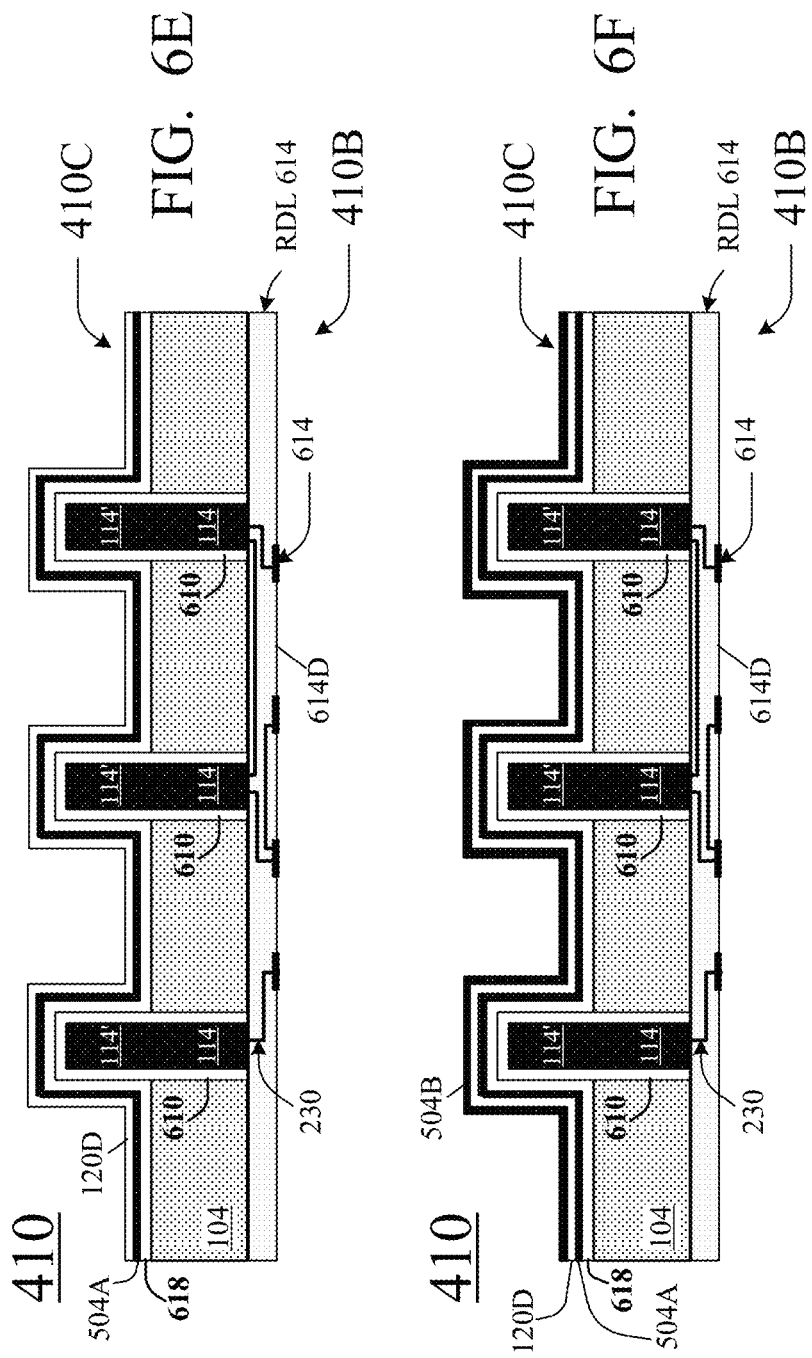

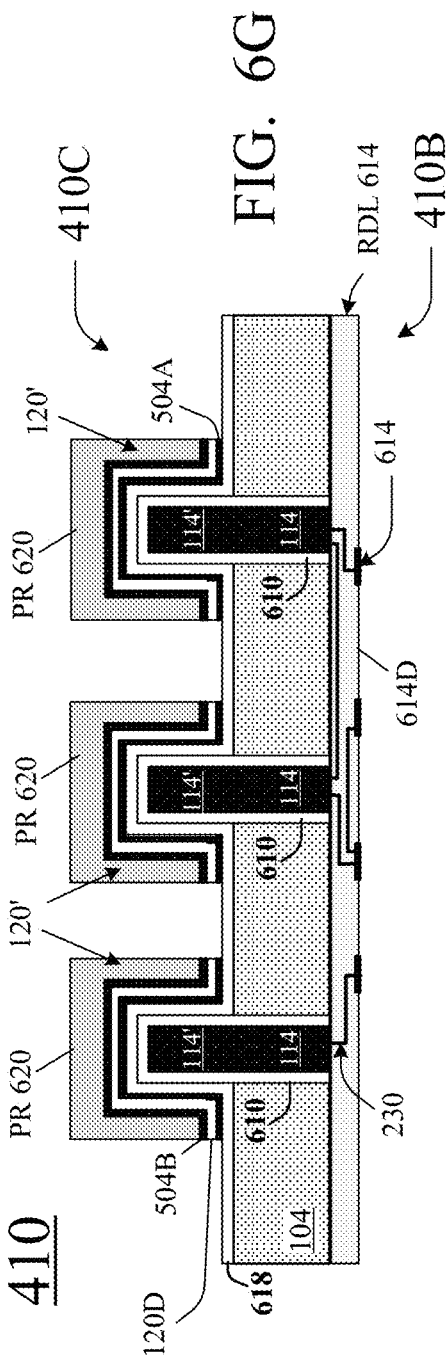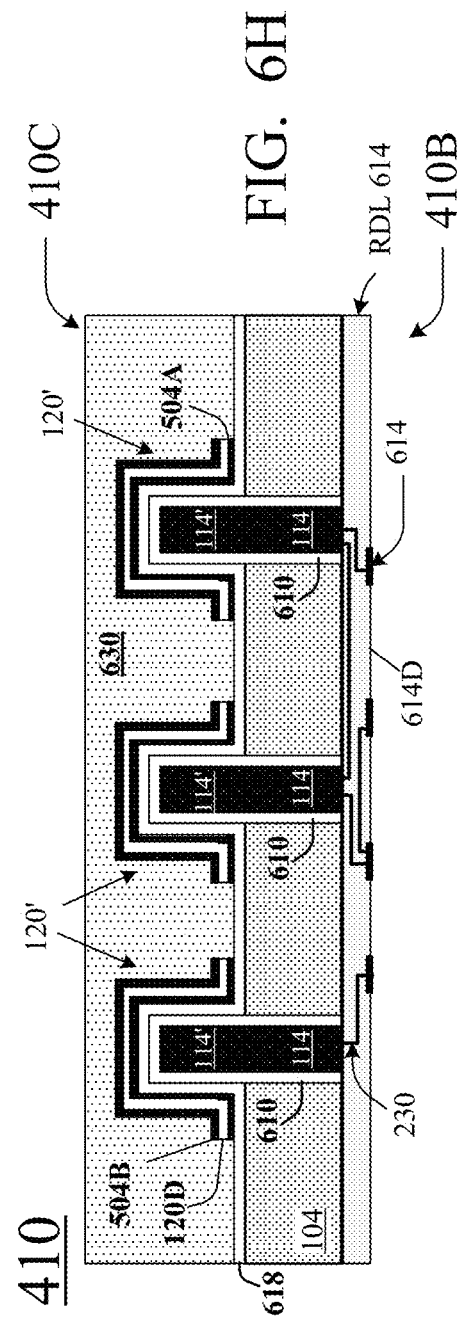

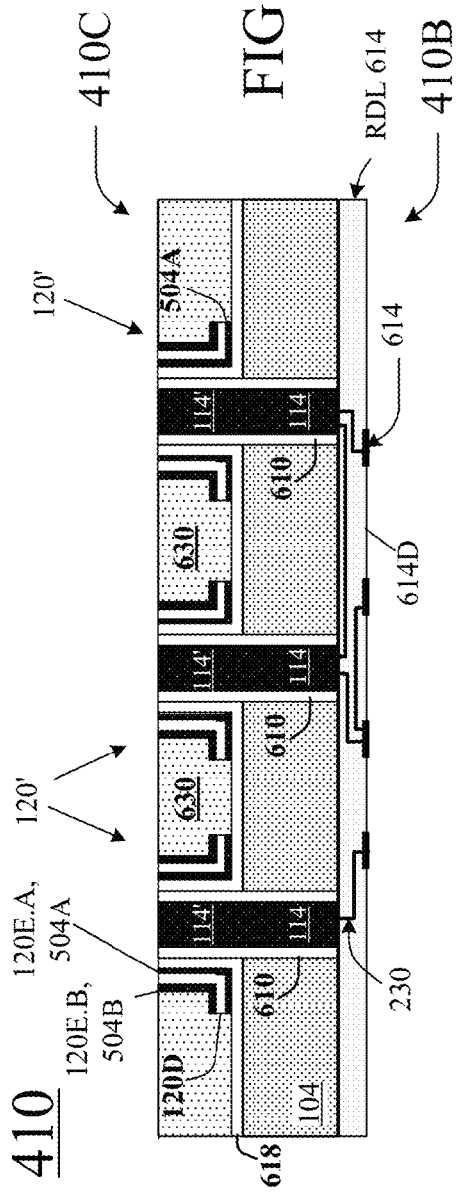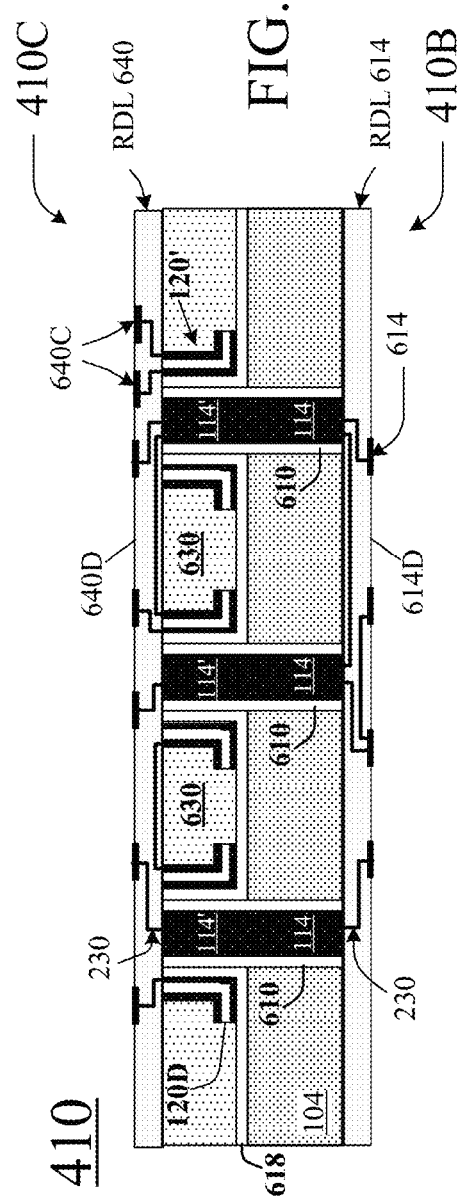

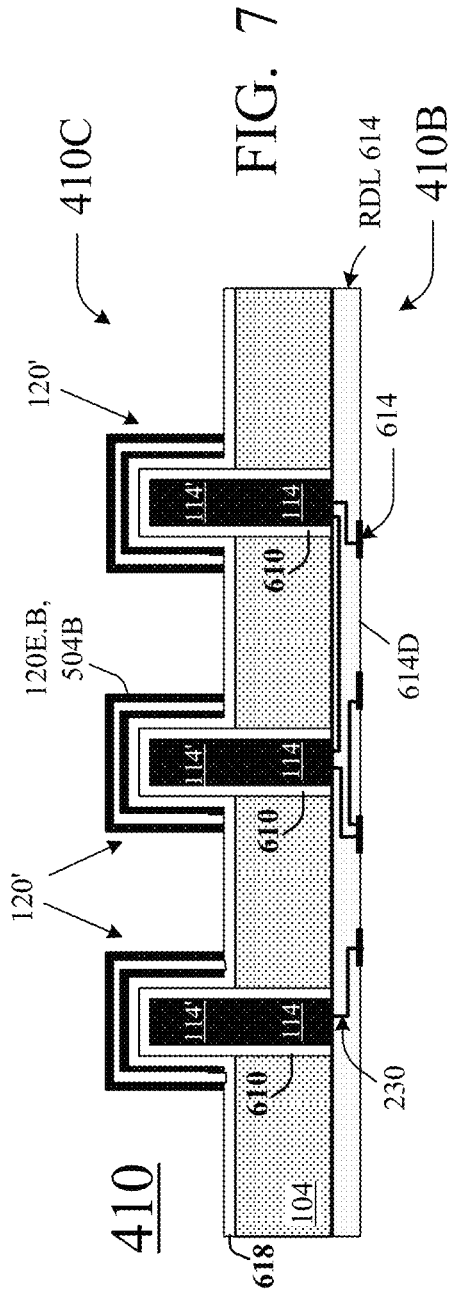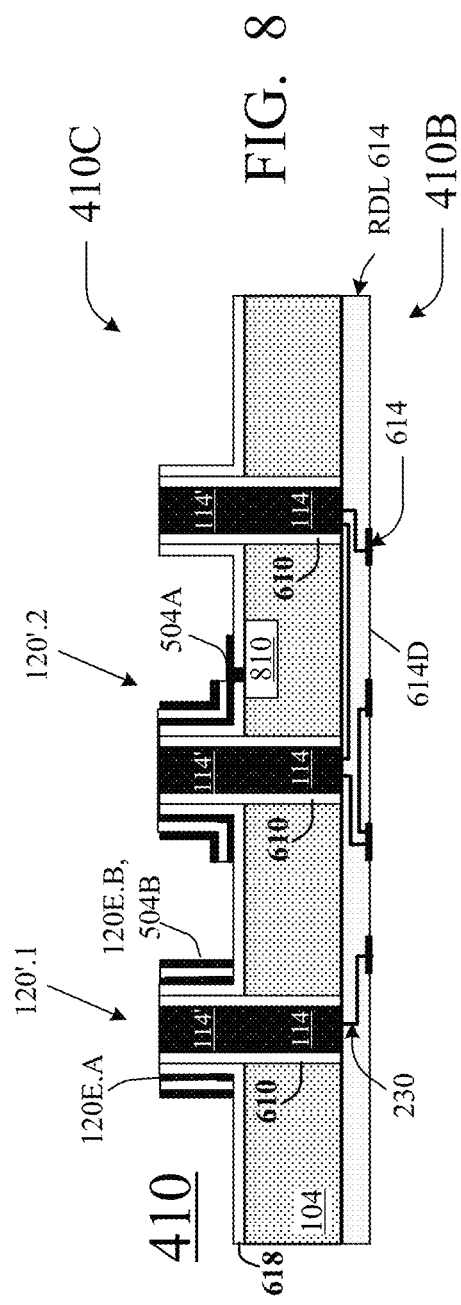

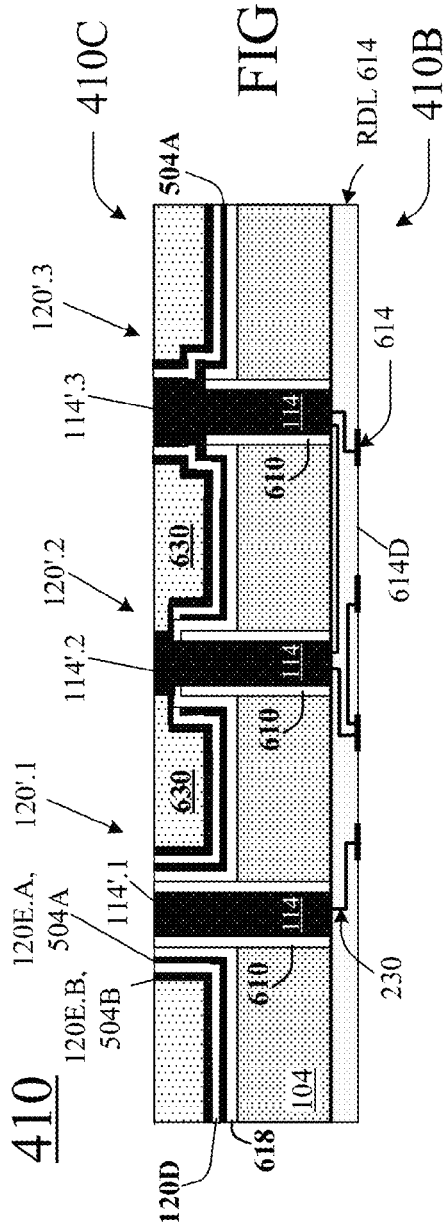
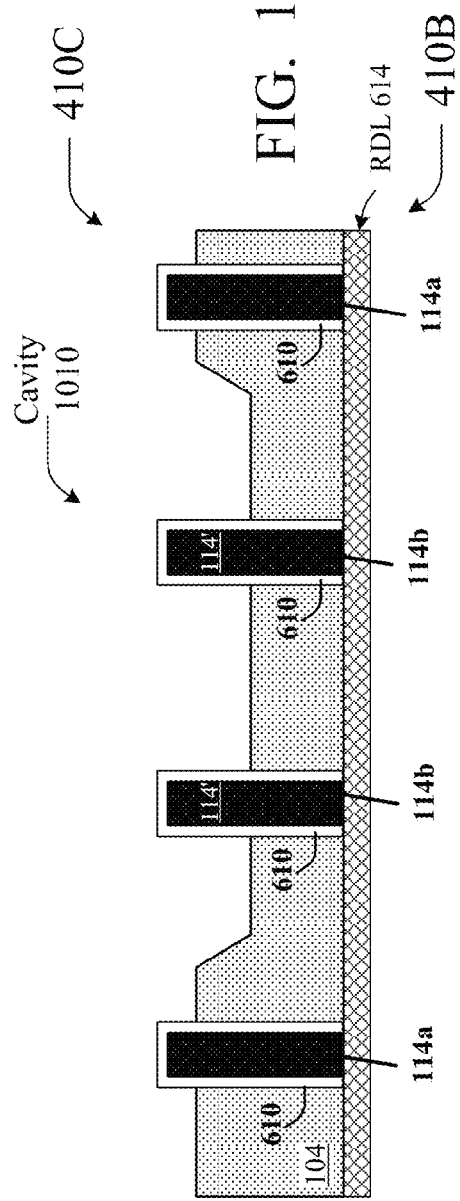

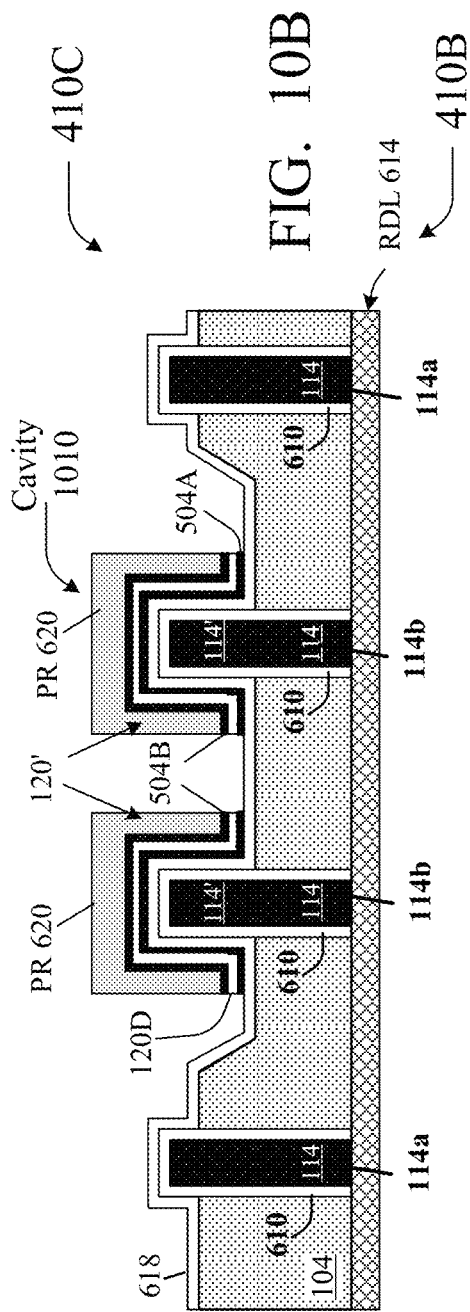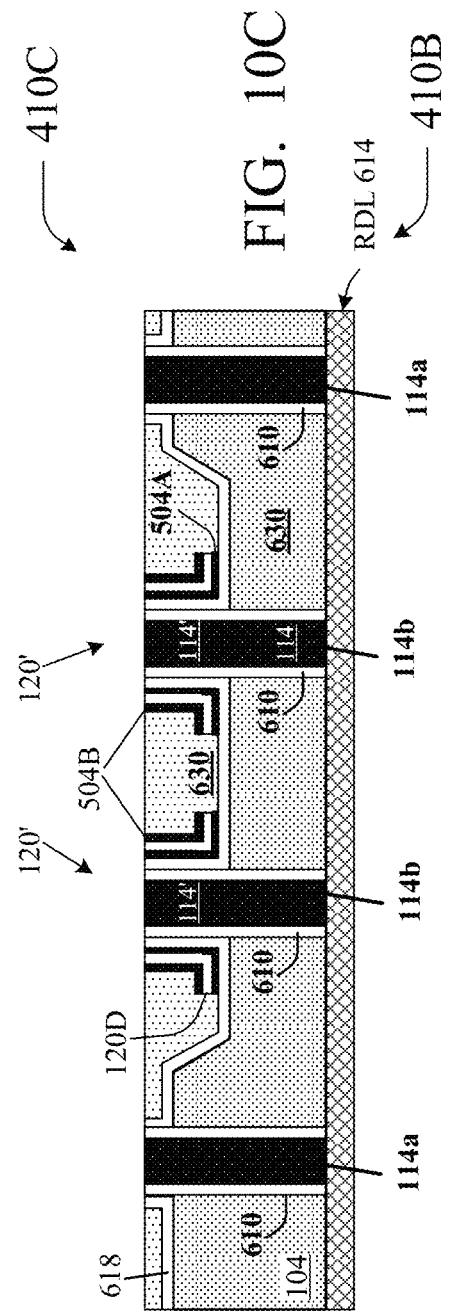

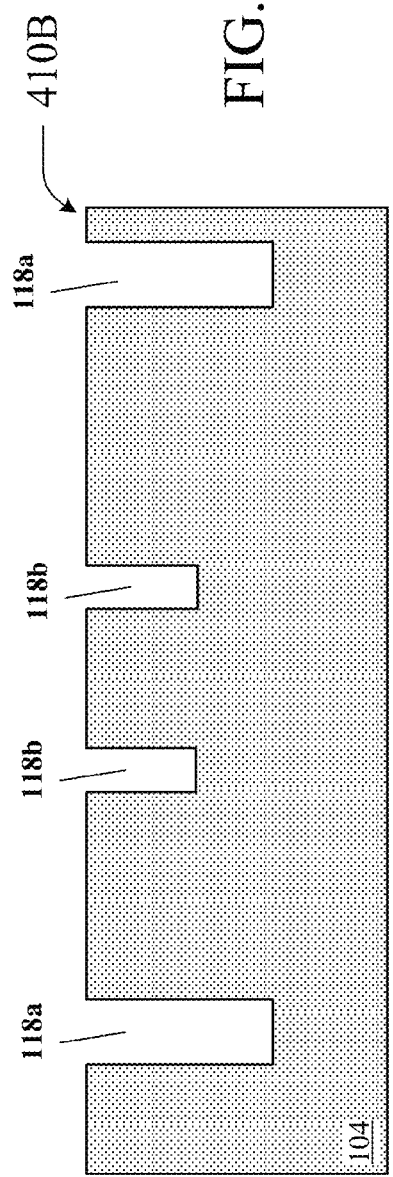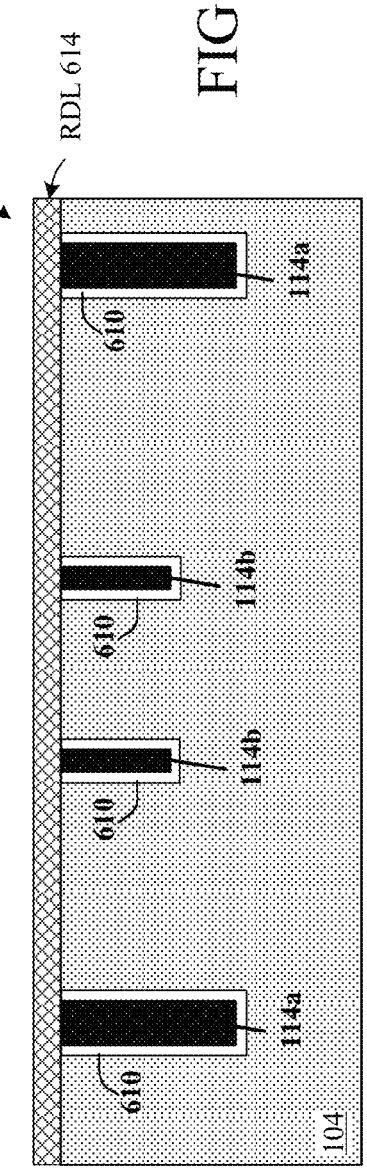

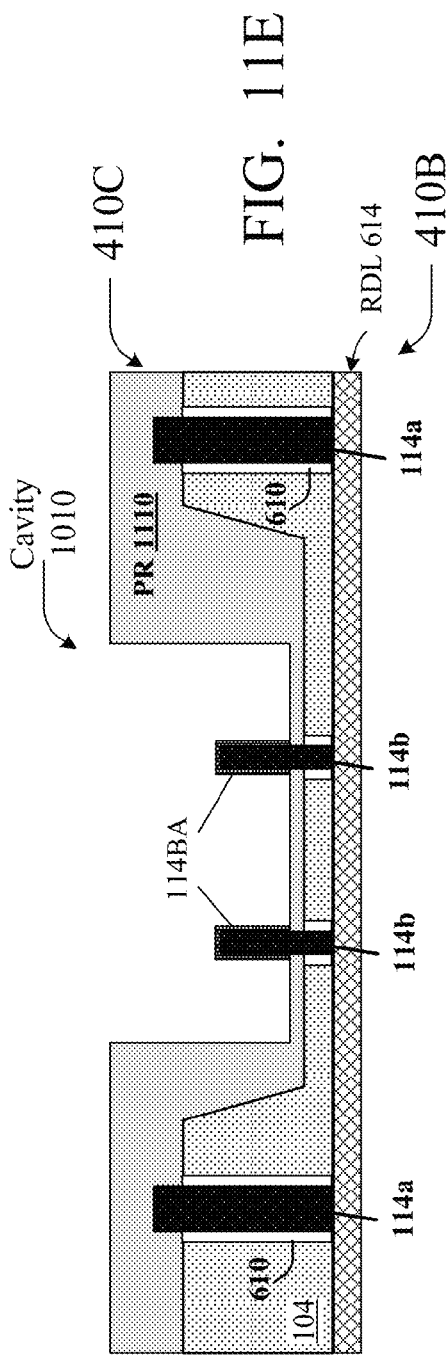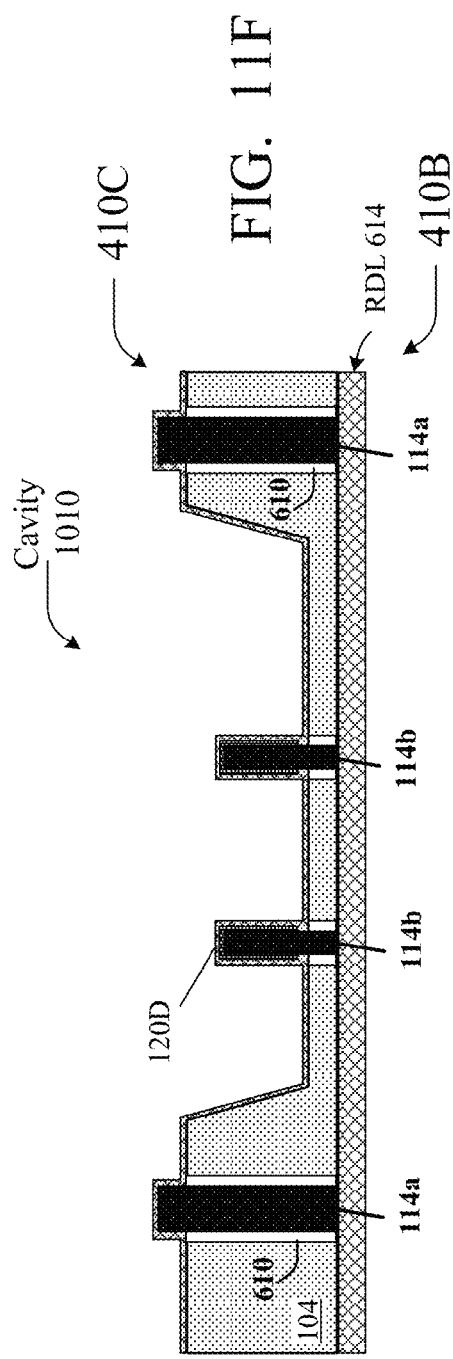

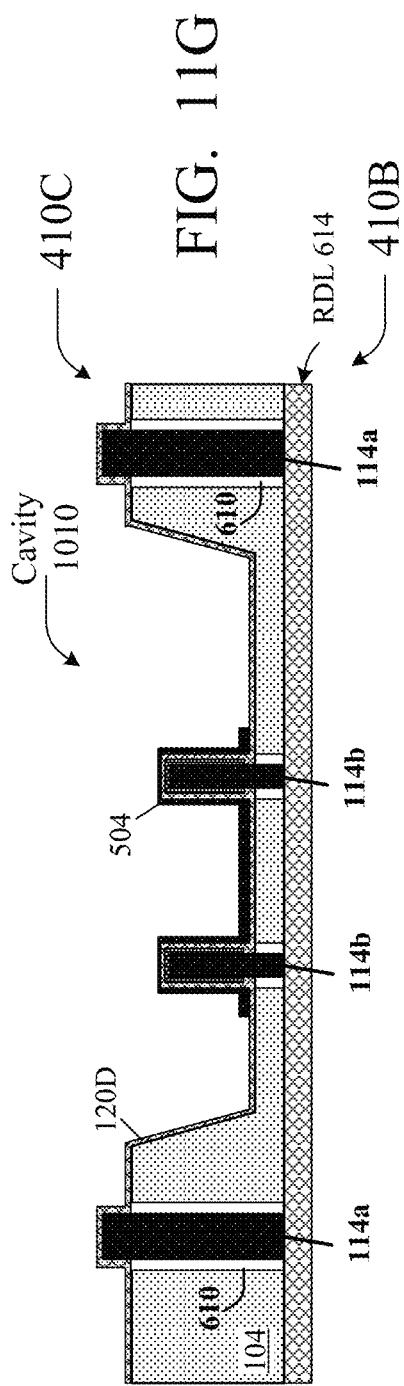
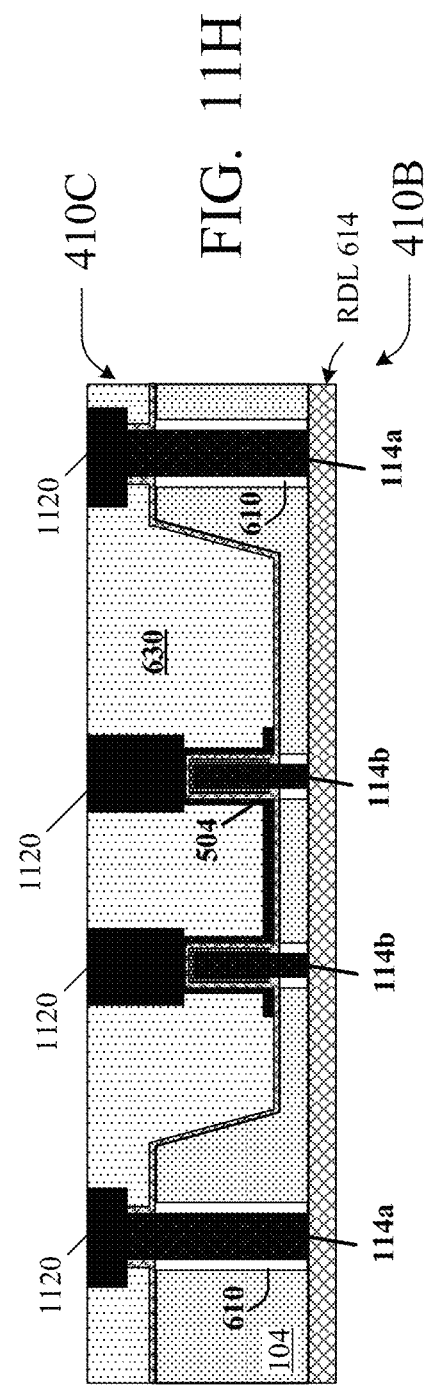

MICROELECTRONIC COMPONENTS WITH FEATURES WRAPPING AROUND PROTRUSIONS OF CONDUCTIVE VIAS PROTRUDING FROM THROUGH-HOLES PASSING THROUGH SUBSTRATES

BACKGROUND OF THE INVENTION

The present invention relates to layout of conductive features in microelectronic components. Some embodiments provide capacitors and electromagnetic shields for microelectronic components.

Capacitors are widely used in electronic circuitry for charge storage (e.g. in memories and power supplies), bandpass filtering (in radio receivers) and for other purposes. A capacitor includes two conductive capacitor electrodes (also called capacitor plates even though they may or may not be flat) separated by dielectric. A simple way to increase the capacitance is to increase the plates' area, but this may undesirably increase the lateral area of the microelectronic component.

One way to increase the capacitor area without increasing the lateral area of an integrated circuit (IC) is to form upward protrusions (fins) of semiconductor material over the IC's substrate, and cause capacitor plates to curve over the fins. FIG. 1 shows such structure as described in U.S. pre-grant patent publication no. 2011/0291166 (Dec. 1, 2011; inventors Booth, Jr. et al.). Fin 50 is formed of a semiconductor layer on dielectric 54 on substrate 58. Dielectric 60, conductor 64, dielectric 68, and conductor 72 are formed over the fin. Conductors 64 and 72 serve as capacitor plates, and dielectric 68 is a capacitor dielectric. Additional fins (not shown) are formed of the same layer as fin 50 to provide transistor regions for fin FETs (filed effect transistors).

The capacitor and the transistors are covered by dielectric 74. Contacts 76 provide access to the capacitor plates.

In a variation, a fin can serve as one of the capacitor electrodes. See also U.S. Pat. No. 8,841,185 (Sep. 23, 2014, Khakifirooz et al.).

Another way to increase the capacitor area is to use opposite sides of the substrate. FIG. 2A illustrates such a scheme described in U.S. Pat. No. 8,373,252 issued Feb. 12, 2013 to DeBaets. Integrated circuit 102 has a semiconductor substrate 104 with transistors (not shown) at the top. Metal lines 110G and 110P are formed at the top to carry respectively a ground voltage and a power supply voltage to the transistors. These lines are connected to respective conductive through-vias 114G, 114P arranged in respective through-holes 118 passing through the substrate 104. Vias 114G, 114P are connected to respective capacitor electrodes 120E.G, 120E.P of a decoupling capacitor 120 formed at the bottom of substrate 104. The capacitor electrodes are flat plates separated by capacitor dielectric 120D. Plate 120E.G surrounds the protrusion of via 114P. Capacitor 120 provides a low-impedance path for high-frequency components of certain signals in the integrated circuit. IC 102 has multiple capacitors 120 (only one of which is shown) at the bottom, and the capacitor area is limited by the lateral area of the IC. See also U.S. Pat. No. 7,851,321 (Clevenger et al., Dec. 14, 2010).

Integration of capacitors with circuits at opposite sides of a substrate is highly desirable for interposers; an interposer provides interconnection between circuits above and below the interposer. FIG. 2B shows a decoupling capacitor scheme for an interposer as described in U.S. Pat. No. 7,510,928 (Savastiouk et al., Mar. 31, 2009). The capacitor 120 is manufactured in interposer 210 provided between integrated circuits 102 and a printed circuit board (PCB) 220. The capacitor's electrodes 120E (shown as 120E.A, 120E.B) are planar electrodes formed over the interposer's substrate 104. Electrodes 120E are separated from each other by dielectric (not shown). Conductive vias 114A, 114B pass through the substrate 104 by way of respective through-holes 118. The vias 114A, 114B carry power and ground voltages from the PCB to the ICs. Via 114A is connected to capacitor plate 120E.A, but passes through a hole in plate 120E.B without contacting the plate. Similarly, via 114B is connected to plate 120E.B, but passes through a hole in plate 120E.A without contacting the plate.

Via 114C carries electrical signals between PCB 220 and ICs 102. Via 114C passes through hole 118 in substrate 104, and passes through capacitor plates 120E.A and 120E.B without contacting the two plates.

Vias 114A, 114B, 114C are connected to conductive lines 230 above the capacitor. Conductive lines 230 are attached to ICs 102.

In this scheme, the capacitor area is limited by the lateral size of substrate 104 and by the room taken by the holes made in the capacitor plates for vias 114.

Another possibility is a vertical capacitor (FIG. 3) in a through-hole 118 in an interposer's substrate 104. See U.S. Pat. No. 6,498,381 (Dec. 24, 2002, Halahan et al.). Electrodes 120E are formed as separate frustoconical layers in hole 118; electrode 120E.A is the inner cone, and electrode 120E.B is the outer cone. The electrodes are separated by dielectric 120D. Another frustoconical conductive layer, schematically shown by straight line 114, can provide a conductive path between the top and bottom of the interposer in the same hole 118. Additional frustoconical conductive layers (not shown) in the hole can provide electromagnetic shielding for the conductive path. Such layers are accommodated by making the hole 118 sufficiently wide, but this may undesirably increase the interposer size. The capacitor size can be increased in the vertical dimension but this requires a deeper hole 118 and complicates manufacturing because it is harder to form capacitor layers in deeper holes.

Other schemes are therefore desired for capacitors, EM shielding structures, and other circuitry.

SUMMARY

This section summarizes some features of the invention. Other features may be described in the subsequent sections. The invention is defined by the appended claims, which are incorporated into this section by reference.

Some embodiments of the present invention provide circuit elements such as capacitors and EM shielding structures, which are suitable for interposers and other circuits that have conductive vias going through substrates. Some embodiments are easily scalable in the sense that the capacitance is not restricted by the component's lateral area. Further, some embodiments can be based on existing manufacturing techniques. (The invention is not limited to such embodiments however except as defined by the appended claims.)

In some embodiments, the inventors provide a capacitor which is vertical as in FIG. 3, but is taken out of the through-hole to a position above (or below) the substrate. A two-capacitor example 410 is illustrated in FIG. 4. Each via 114 forms a protrusion 114' above the substrate 104, and each capacitor 120 wraps around the corresponding protrusion 114' and is separated from the protrusion by dielectric 420. More particularly, each capacitor's inner electrode 120E.A, outer electrode 120E.B, and dielectric 120D wrap around the corresponding protrusion 114' like a sleeve. Vias 114 can carry any signals or power or ground voltages between PCBs, ICs, or any other components; thus, unlike fins 50, vias 114 do not have to be dedicated to capacitors. The capacitor electrodes 120E can be connected to conductive lines (not shown) above or below the capacitor (e.g. conductive lines on substrate 104 or in a redistribution layer above the capacitors), or to via protrusions 114', or to any other features, e.g. transistor electrodes or back-end-of-line features (BEOL) which may or may not be made of the same layers as the capacitor electrodes (BEOL features are features made of layers overlying the transistors; the invention is not limited to structures with transistors however). Structure 410 can be an integrated circuit and may or may not be an interposer.

In this embodiment, the capacitor area can be increased by making the capacitor taller and without changing the substrate dimensions. Also, the capacitors do not have to extend into through-holes 118 (the holes are not shown in FIG. 4); each hole 118 does not have to be wider than needed for the corresponding via 114; the substrate area adjacent to the holes is available for circuit elements or other purposes. The invention is not limited to such embodiments however; for example, in some embodiments, holes 118 are wider than needed for vias 114, and holes 118 may contain other conductive elements including, for example, a capacitor plate.

The capacitors do not have to be circular cylinders but can be conical or frustoconical or of other shapes.

Individual capacitors 120 formed at different vias 114 can be interconnected in many ways to provide different capacitor circuits, and FIGS. 5A and 5B show an example of a circuit as in FIG. 2B that provides a large capacitor covering almost the entire substrate. FIG. 5A is a schematic cross-sectional and circuit-diagrammatic view, and FIG. 5B is a schematic top view. Each capacitor 120 can be cylindrical as in FIG. 4, but in the cross-sectional view of FIG. 5A the capacitor electrodes 120E appear as vertical lines. Electrodes 120E.A are part of a layer 504A covering the entire substrate 104 except at locations of via protrusions 114'. Electrodes 120E.B are also part of a single layer 504B; and dielectric 120D is made of a single layer extending between the layers 504A, 504B. Each layer 504A, 504B, 120D covers the entire substrate 104 except at vias 114. The capacitors 120 at each via 114 are thus part of a single capacitor covering the entire substrate except at vias 114. If desired, layers 504A and 504B can be connected to two of the vias 114 as in FIG. 2B, e.g. by interconnect lines (not shown) arranged in substrate 104 or above the capacitors. Vertical extensions 120E of capacitor plates 504A, 504B along the via protrusions 114' increase the capacitance without increasing the dimensions of substrate 104.

Additional layers may wrap around the vertical portions of capacitors 120 of FIG. 4 or 5A-5B to provide additional capacitors with electrodes wrapping around the via protrusions 114'. Also, additional layers can be provided inside the vertical extensions 120E.A to provide additional capacitors.

The via protrusions 114' can be connected to other circuitry above the capacitor plates; the capacitor plates do not restrict the use of vias 114 nor the lateral size of circuitry above or below the capacitors.

In some embodiments, a via protrusion 114' serves as a capacitor plate. The other plate is provided by layer 504A; layer 504B is omitted at least around the protrusion. Alternatively, layer 504B serves as the other plate, and layer 504A is removed at least around the protrusion.

Similar techniques can provide EM shielding. For example, in a variation of FIG. 4 or 5A-5B, layer 504B is omitted, and layer 504A is used as an EM shield for protrusions 114' and/or substrate 104. For example, if layer 504A of FIG. 5A is provided in an interposer interconnecting a PCB with ICs (as in FIG. 2B), then layer 504A can be used to shield ICs 102 from PCB circuitry.

In some embodiments, the protrusions 114' can be formed without additional photolithography: vias 114 can be formed by standard techniques, and protrusions can be obtained for example by a suitable blanket etch of substrate 104. However, in some embodiments, the substrate is patterned by a selective (non-blanket) etch to form protrusions of different heights as needed for different purposes.

These features and embodiments do not limit the invention. Other embodiments and variations are within the scope of the invention as defined by the appended claims.

BRIEF DESCRIPTION OF THE DRAWINGS

FIGS. 1, 2A illustrate vertical cross sections of microelectronic components according to prior art.

FIG. 2B illustrates a vertical cross section and a circuit-diagram of a microelectronic component according to prior art.

FIG. 3 illustrates a perspective cut-away view and a circuit diagram of a microelectronic component according to prior art.

FIG. 4 illustrates a perspective view of a microelectronic component according to some embodiments of the present invention.

FIG. 5A illustrates a vertical cross section and a circuit-diagram of a microelectronic component according to some embodiments of the present invention.

FIG. 5B is a plan view of a microelectronic component according to some embodiments of the present invention.

FIGS. 6A, 6B, 6C.1 illustrate vertical cross sections of microelectronic components at intermediate fabrication stages according to some embodiments of the present invention.

FIG. 6C.2 is a plan view of a microelectronic component at an intermediate fabrication stage according to some embodiments of the present invention.

FIGS. 6D, 6E, 6F, 6G, 6H, 6I, 6J, 7, 8, 9, 10A, 10B, 10C, 11A, 11B, 11C, 11D, 11E, 11F, 11G, 11H, 12A, 12B illustrate vertical cross sections of microelectronic components during fabrication according to some embodiments of the present invention.

DESCRIPTION OF SOME EMBODIMENTS

Figure 1:
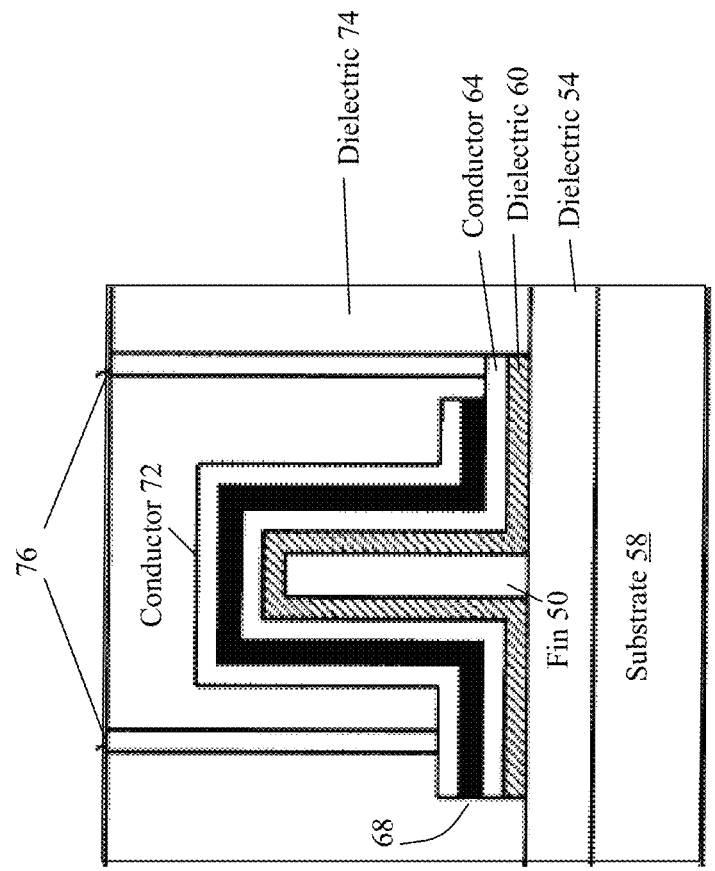

The embodiments described in this section illustrate but do not limit the invention. The invention is defined by the appended claims.

In this disclosure, the term "conductive" denotes electrical conductivity unless noted otherwise. The term "insulator" denotes electrical insulation. "Dielectric" denotes any electrical insulator, not necessarily with a high dielectric constant.

Some embodiments of the invention will now be illustrated on an interposer example, but as noted above the invention is not limited to interposers.

FIG. 6A illustrates beginning stages of fabrication of some implementations of structure 410 described above in connection with FIG. 4 or FIGS. 5A-5B. For ease of reference, the top side (capacitor side) of structure 410 is marked 410C in FIGS. 4, 5A, 6A, and subsequent figures; the bottom side is marked 410B. FIG. 6A shows the structure upside down, with the capacitor side 410C at the bottom. The invention is not limited to particular spatial orientations shown in the drawings.

The fabrication stage of FIG. 6A can be conventional. Substrate 104 can be any suitable material, e.g. semiconductor, glass, metal, ceramic, organic, inorganic, or mixture of the above types (composite), or other type as appropriate. For example, if substrate 104 is used to form transistor regions, then monocrystalline silicon or other semiconductor material can be appropriate. Other factors in choosing the substrate material and thickness include rigidity (for mechanical support), coefficient of thermal expansion (CTE), and possibly others.

Holes 118 are formed in the substrate's top surface, by a masked etch, or laser or mechanical drilling, or some other suitable method. Alternatively, the holes can be formed simultaneously with the substrate, e.g. if the substrate is made by molding or printing. In the embodiment shown, holes 118 are blind, not yet going through the substrate. The holes are then lined with dielectric 610 (which can be omitted if the substrate itself is dielectric). Then the holes are filled up with conductor 114. Many variations of these techniques are possible; see e.g. U.S. patent application Ser. No. 14/214,365 filed Mar. 14, 2014 by Shen et al., incorporated herein by reference; and see the aforementioned U.S. Pat. Nos. 6,498,381 and 7,510,928, both incorporated herein by reference. Thus in one variation, conductor 114 is a film lining the surfaces over the dielectric 610 but not filling up the holes. Further, as stated in U.S. Pat. Nos. 6,498,381 and 7,510,928, substrate 104 may have been preprocessed to form circuitry (not shown) such as transistors, resistors, capacitors, etc.; BEOL circuitry may also have been formed; or only parts of such circuitry may have been formed; and/or such circuitry can be formed later during or between other fabrication steps described below, or there can be no such circuitry ever formed.

One example of such circuitry is redistribution layer (RDL) 614, possibly formed as one or more BEOL layers, and shown in FIG. 6B, formed on substrate 104 after the stage of FIG. 6A. RDL 614 provides conductive lines 230 and contact pads 614C which can be later attached to other circuits, e.g. ICs 102 (FIG. 2B), a PCB, or possibly other circuits. Lines 230 interconnect the vias 114 and contact pads 614C in a desired pattern. Lines 230 are formed from one or more conductive layers, and these layers can be separated from substrate 104 and each other by dielectric layers summarily shown at 614D.

Then (FIG. 6C.1) substrate 104 is thinned from the bottom (capacitor) side 410C to turn holes 118 into through-holes. The protruding portions of vias 114 are marked 114'. FIG. 6C.2 shows an exemplary bottom view, with vias 114 arranged in an array. The vias can be arranged in any pattern. There can be any number of vias 114, including possibly only one via. The vias can be circular or non-circular, cylindrical or conical or frustoconical, or of other shape. Different vias may have different shapes and dimensions in the same structure. In an exemplary embodiment, each via 114 is a circular cylinder of a diameter of D of 5 to 100 microns and a height H of 20 to 500 microns; the via aspect ratio H/D is 3 to 10; dielectric 610 is 0.05 to 1 micron thick (e.g. silicon dioxide or silicon nitride or some other type); protrusion height H' is 40 to 60% of the via height H; but this illustration is not limiting.

Before substrate thinning, a handle wafer (not shown) can be attached to the top side 410B of the structure to facilitate substrate handling, reduce or eliminate substrate warpage, improve heat dissipation during manufacturing, or maybe for other purposes. The handle wafer can be later removed at any suitable stage, e.g. after capacitor formation.

Via protrusions 114' above substrate 104 will provide support for capacitor electrodes. The protrusions can have any dimensions consistent with the fabrication processes. The capacitance increase provided by the protrusions can be estimated as follows. Suppose each protrusion 114' is a circular cylinder of a diameter D and a height H', and the vias 114 are at a pitch P. The vertical capacitor's area is approximately equal to the protrusion's lateral surface area $A_0=\pi*D*H'$. Actually, the height of the capacitor electrodes can be slightly less than H' due to dielectric or other layers possibly formed on substrate 104 between the substrate and the capacitor electrodes. Let us denote the capacitor electrode height as H''. Thus, $A_0$ is above $\pi*D*H''$. Denoting the substrate area as $A_s$, the number of vias 114 that can be made at pitch P is about $A_s/P^2$. Therefore, the total capacitor area is about:

$$A_0*A_s/P^2 = \pi*D*H''*A_s/P^2$$

Let R denote the ratio of this capacitance to the substrate area $A_s$, i.e. the "sleeve" capacitance (vertical capacitance) per unit substrate area. Then:

$$R=\pi*D*H''/P^2$$

Expressed as a percentage PR of the substrate area $A_s$, the vertical capacitance is R*100, i.e.:

$$PR=100*\pi*D*H''/P^2, \text{ or}$$

$$PR=100*H''*(\pi*D/P^2)$$

Some embodiments use the following dimensions:

TABLE 1

| D (μm) | P (μm) | $\pi*D/P^2$ (1/μm) |
|---|---|---|
| 10 | 20 | 3.14/40 |
| 5 | 10 | 3.14/20 |

Let us assume that the height H' of protrusions 114' varies between 5 and 260 μm. This is a feasible range, and other values are possible. The capacitor electrode height H'' can be about the same, or a few microns smaller (in embodiments described below, the electrodes do not reach the substrate 104 due to additional dielectric to be placed on the substrate; the additional dielectric and the capacitor electrodes and capacitor dielectric can be each less than 1 micron thick, so the electrode height H'' can be about 1 to 259 μm, but larger heights are possible).

In Table 1 above, the largest $D/P^2$ ratio is in the last line. For this line, for H''=10 μm, the PR value is 15.7%. For the electrode height H'', 100 μm, the PR value increases proportionally to 157%. For the electrode height H''=250 μm, the PR value becomes 392%, i.e. the vertical capacitor area is almost four times the substrate area. (The total capacitance, including the area between the vias 114, is larger of course.) This is a significant improvement compared to the capacitors of FIGS. 2A-2B where the capacitor area is no larger than the substrate area.

FIG. 6D shows the next fabrication stage; the structure is shown upside down, with capacitor side 410C on top.

As noted above, dielectric 610 is absent in some embodiments (e.g. if substrate 104 is dielectric). If desired, a new dielectric layer 618 can be formed over the protrusions 114' to insulate the protrusions from the capacitor electrodes and/or to protect the substrate 104. The new dielectric can protect substrate 104 from contamination in subsequent steps, e.g. protect a silicon substrate from metallic impurities. In some embodiments with the dimensions H and D described above, dielectric 618 is a 100 to 700 nm layer of silicon dioxide or silicon nitride or silicon carbide or their combinations or any other suitable dielectric, deposited by CVD (chemical vapor deposition) or PVD (physical vapor deposition) or ALD (atomic layer deposition) or some other suitable process. If dielectric 610 is also present, the combined thickness of dielectrics 610 and 618 around each protrusion 114' is 150 to 750 nm. These dimensions are given for illustration only and are not limiting.

In some embodiments, layer 618 is made of a flowable material, e.g. organic polymer, flown over the structure and cured to solid phase. Exemplary organic-polymer-based materials include liquid crystals and those used as encapsulants and underfills for microelectronic components. In some embodiments, the flowable layer 618 selectively wets the surface of substrate 104 but not of dielectric 610, or not of protrusions 114' if dielectric 610 is absent. Hence, protrusions 114' and dielectric 610 project above the (possibly planar) top surface of dielectric 618. However, if some of dielectric 618 remains on the projecting portions of protrusions 114' or dielectric 610, then dielectric 618 can be removed from such projecting portions before or after being cured, by brush cleaning for example. This scheme can be used to omit the dielectric 618 over protrusions 114' if desired. Also, dielectric 618 can be removed from only over selected protrusions 114' to connect the subsequently formed capacitor electrodes to such selected protrusions 114' (as described below in connection with FIG. 9 for example). Further, brush cleaning may be unnecessary, especially if dielectric 618 has low viscosity. Exemplary suitable room-temperature viscosity values are 200 poise or less, possibly 100 poise or less, or even 10 poise or less. Exemplary low-viscosity materials suitable for dielectric 618 are those used for capillary underfills. Such materials can be deposited by transfer molding or other techniques. The resulting layers 618 may have any suitable thickness, possibly 1 µm or more, or even 5 µm or more, or even 20 µm or more if desired.

The dielectric 610 and/or 618 surrounding each protrusion 114' corresponds to dielectric 420 of FIG. 4.

Then a conductive layer 504A is formed to cover the top surface of the structure. This layer can be conformal, its profile follows the underlying topology; its thickness over the sidewalls of protrusions 114' is less than half of the distance between the protrusions. Exemplary thickness is 30 to 1000 nm. Layer 504A can be any conductive material, e.g. metal, TiN, TaN/Ta (a layer of TaN and a layer of tantalum), nickel alloys, copper or its alloys, aluminum or its alloys, tungsten or its alloys, various combinations of these materials, heavily doped polysilicon, conductive polymer, or some other conductor. The choice of material and thickness depends on subsequent processing. For example, a copper layer can be formed by electroless plating possibly followed by electroplating, or a combination of copper and barrier layers (e.g. nickel) can be used; see the aforementioned U.S. Pat. No. 7,510,928. However, if layer 504A will later be patterned, then aluminum may be preferred because it is easier to pattern than copper. In one example, aluminum is formed by PVD (possibly ionized PVD sputtering), or CVD, or ALD to a suitable thickness, e.g. 200 nm. These are non-limiting examples.

Conformal dielectric layer 120D (FIG. 6E) is formed to cover the top surface of layer 504A. The dielectric material and thickness depend on operational requirements and available manufacturing processes. For example, dielectric 120D can be silicon dioxide or silicon nitride formed by CVD or PVD, or a high-k dielectric (high dielectric constant dielectric), e.g. hafnium oxide, aluminum oxide, tantalum pentoxide, zirconium dioxide, and/or other materials that can be formed by ALD or sol-gel methods to a thickness of 5 to 50 nm or higher. Dielectric 120D may be fabricated as multiple thin dielectric layers formed sequentially over one another to suppress the evolution of thin film defects such as pinholes for example. Other possible fabrication techniques are described in the aforementioned U.S. Pat. No. 7,510,928, and still other techniques are possible.

Conformal conductive layer 504B (FIG. 6F) is formed to cover the top surface of dielectric 120D, possibly but not necessarily by the same techniques as layer 504A and possibly but not necessarily of the same thickness. Many variations are possible. For example, layer 504B may be non-conformal, e.g. may have a planar top surface overlying the protrusions 114'. The choice of material and thickness is unlimited and depends on operational requirements and available manufacturing processes.

In the embodiment being described each layer 504A, 120D, 504B covers the entire substrate, but in other embodiments any one of layers 504A, 120D can be patterned before deposition of the next layer.

Subsequent processing depends on particular applications. In the example of FIG. 6G, the three capacitor layers are patterned using a single photoresist mask 620. In this example, the three layers are removed between protrusions 114' to form a separate capacitor 120 at each protrusion 114'. For ease of reference below, these separate capacitors are marked 120'. In other embodiments, some or all of capacitors 120' are interconnected to form larger capacitors. For example, if only one capacitor is desired as in FIG. 5A, then the patterning step is omitted.

In some embodiments, the three layers are patterned using separate masks. For example, structure 410 may include areas (not shown) without vias 114, and in these areas any one or more of layers 504A, 120D, 504B can be patterned to provide any desired circuitry or connect such circuitry to capacitors 120'.

Resist 620 is removed (FIG. 6H), but could be left in place in some embodiments. Dielectric layer 630 is formed over substrate 104. Dielectric 630 may or may not cover the vias 114 (it covers the vias in FIG. 6H), and may or may not have a planar top surface as in FIG. 6H. The dielectric can be a molding compound deposited by molding or spin-on method from a flowable material solidified when cured, e.g. polyimide or some other organic polymer; examples are polymers based on epoxy, silicone, polyurethane, poly-phenylene benzobisoxazole (PBO), or benzocyclobutene (BCB). Another spin-on possibility is low-melting-temperature glass. Alternatively, silicon dioxide or silicon nitride can be used, deposited by CVD or PVD for example. Layer 630 may include a combination of layers of different materials, e.g. a lower layer of silicon dioxide with BCB on top. In some embodiments, dielectric 630 includes voids between the protrusions 114' to reduce capacitance between adjacent capacitors 120'; the voids can be formed by forming a fluorinated silicon dioxide layer at higher pressures as part of layer 630. These techniques are well known in the art, and other techniques and deposition methods can be used.

Then (FIG. 6I) protrusions 114' are exposed on top to make them available for electrical connection (e.g. connections to PCB 220 or ICs 102 of FIG. 2B or to other circuits). The exposure process can be, for example, chemical mechanical polishing (CMP) that removes unwanted portions of layers 630, 504B, 120D, 504A, 618, and 610. Other processes can also be used.

In some CMP embodiments, to reduce the risk of shorting the capacitor electrodes 120E.A and 120E.B to each other or to a protrusion 114', the conductive layers 504A and/or 504B and/or 114' are recessed slightly after the CMP to a level below the surface of one or more of dielectric layers 630, 120D, 618, 610. This can be done for example by a wet etch selective to the dielectric layers or some other process. In another example, if layers 504A and 504B are aluminum or titanium or tungsten, then RIE (reactive ion etching) can be used. These examples are not limiting. An exemplary depth of the recess can be under 10 nm below the dielectric. The capacitor electrodes can then be contacted near a protrusion 114' at different angles around the protrusion to reduce the risk of shorting the capacitor electrodes to each other. (The capacitor electrodes can be contacted by RDL lines 230 shown in FIG. 6J, and the contacts can be spread around a protrusion 114' to reduce the risk of shorting.) Alternatively or in addition, layer 504B can be recessed below the level of the top surface of layer 114', and/or layer 504A can be recessed below the level of the top surface of layer 504B.

Then connections are formed to via protrusions 114' and capacitor electrodes 120E.A and 120E.B as desired. For example (FIG. 6J), RDL 640 is formed over the structure to interconnect the features 114', 120E.A, 120E.B by the RDL lines 230 in a desired pattern and connect them to contact pads 640C at the top of the RDL. Contact pads 640C can be connected to other circuit elements (e.g. PCBs or ICs) by solder, thermocompression, conductive adhesive, discrete wires, or combination of the above, and/or other techniques.

If the handle wafer was used at side 410B, the handle wafer can be removed at this or a subsequent fabrication stage.

As seen in FIGS. 6I-6J, layers 504A, 120D and 504B are not planar; each layer forms, at each protrusion 114', a sleeve-like region around the protrusion, wrapping around and extending along the protrusion (similar to FIG. 5B in top view, though the round shape is unnecessary). The sleeve regions formed by conductive layers 504 (504A and 504B) do not extend into the corresponding through-hole 118 containing the via 114 and can be electrically insulated from the top surface of the hole (e.g. if layers 504 are not electrically connected to the protrusion). The sleeve's thickness for each of layers 504A, 120D, 504B is relatively small on the protrusion sidewall. The sleeve's thickness of each layer depends on the layer's thickness (which is a micron or less in some embodiments) and can be defined as the distance between the sleeve's inner and outer surfaces, i.e. the surface facing the protrusion and the opposite surface). The sleeve's thickness can be variable but it is smaller than the height of the sleeve, e.g. the height of the sleeve's inner surface (the sleeve's height is the minimum height if the sleeve's height varies around the protrusion). See exemplary dimensions given above. Layer 504B may have a planar top surface however.

As noted above in connection with FIGS. 6D-6G, the capacitor layers 504A, 120D, 504B can be patterned separately at any suitable stage. For example, in some embodiments, layer 504A is not patterned at all, and provides electromagnetic shielding between circuitry above this layer and circuitry below this layer, e.g. between die above and a PCB below (not shown). Such unpatterned shielding layer 504A can be provided, for example, by using the mask 620 of FIG. 6G to pattern the layer 504B but not 504A.

FIG. 7 illustrates another example, at the same fabrication stage as in FIG. 6G (before removal of the capacitor layers above the protrusions 114'). In this example, layer 504A was deposited and patterned to have straight sidewalls around each protrusion 114', without lateral extensions at the bottom. Then layer 120D was deposited and similarly patterned. Then layer 504B was deposited and similarly patterned. Due to the absence of lateral extensions at the bottom, vias 114 can be brought closer together without shorting the adjacent capacitors 120'.

Of note, in some embodiments, the structure is an interposer; the side 410B is connected to die such as ICs 102 in FIG. 2B, and the capacitor side 410C is connected to a PCB such as 220 in FIG. 2B. In many IC systems, the PCB's contact pads have a lower pitch than the die's contact pads due to limitations of PCB fabrication technology. If protrusions 114' are attached to the PCB contact pads, i.e. RDL 640 is omitted, then the pitch of vias 114 needs to match the larger pitch between the PCB contact pads. The larger pitch requirement for vias 114 may result in sufficient room for lateral capacitor extensions as in FIG. 6J. However, if there is less room for the capacitors, then the structure of FIG. 7 may be preferable.

Different capacitors may have different profiles in the same structure. For example, in FIG. 8 capacitor 120'.1 is as in FIG. 7; capacitor 120.2 is as in FIG. 6G; there is no capacitor over the rightmost protrusion 114'—the capacitor layers were removed over that protrusion, or were never formed (if the capacitor layers were patterned by a lift-off process or formed by printing for example). Further, as noted above, the capacitor electrodes 120E can be connected to underlying features; in FIG. 8, the electrode 120E.A of capacitor 120'.2 is connected to a circuit element 810 (e.g. a resistor, or a transistor electrode, or some other type) formed in substrate 104. The connection is by means of a hole in dielectric 618; the hole was made before deposition of layer 504A.

In another example (FIG. 9), capacitor electrodes 120E can be connected to some or all of protrusions 114'. For example, FIG. 9 shows a structure at the stage of FIG. 6I, with three capacitors 120'.1, 120'.2, 120'.3 formed around the respective protrusions 114'.1, 114'.2, 114'.3. The capacitor electrodes are interconnected as in FIG. 2B to form a large capacitor, but any other capacitor connections can be used instead. In FIG. 9, capacitor electrode 120E.A of capacitor 120'.3 physically contacts the protrusion 114'.3; and capacitor electrode 120E.B of capacitor 120'.2 physically contacts protrusion 114'.2. The structure can be formed as follows for example. First, fabrication proceeds as in FIGS. 6A-6D, but before deposition of conductive layer 504A the dielectric 610/618 is selectively removed from over the protrusion 114'.3 to expose the protrusion's top and sidewall. The selective removal can be using a brush if dielectric 618 is a flowable material and dielectric 610 is absent as described above. Alternatively, the selective removal can be a masked etch. The mask (not shown) can be formed of two masking layers for example: first a planar masking layer is formed to cover the substrate 104 between the vias 114 but expose the top segments of protrusions 114' (this masking layer can be formed without photolithography, possibly as a low viscosity polymer-based material as described above); then the other masking layer (e.g. photoresist) is formed to cover all of substrate 104 and protrusions 114' except for protrusion 114'.3. The top portion of protrusion 114'.3 is not covered by the two masking layers.

After the etch exposing the top and sidewall of protrusion 114'.3, the two masking layers are removed. Then layer 504A is deposited as described above, to physically contact the top and sidewall of protrusion 114'.3.

Then layer 504A and dielectric 610/618 are selectively removed over the top portion of protrusion 114'.2, to expose the protrusion's top and sidewall. The selective removal can be accomplished for example by means of two masking layers similar to those described above for protrusion 114'.3.

Then the two masking layers are removed, and dielectric 120D is formed as described above (FIG. 6E). A portion of dielectric 120D is removed over protrusion 114'.2 to expose the protrusion's top and sidewall but not to expose the layer 504A. This removal can be accomplished by means of two masking layers as described above.

The masking layers are then removed, and conductive layer 504B is deposited as described above (FIG. 6E) to physically contact the top and sidewall of protrusion 114'.2.

Subsequent fabrication steps can be as described above.

Additional dielectric and conductive layers similar to 120D and 504 can be made by the same or similar techniques to provide additional capacitor electrodes or EM shielding or other features wrapping around any one or more protrusions 114' in a similar, sleeve-like manner with the sleeve's thickness being smaller than the sleeve's height. The sleeves of such features may or may not be similarly connected to selected protrusions 114' and/or each other. For example, an additional dielectric layer can be made over the structure similar to 120D, and then an additional conductive layer similar to 504A or 504B can be deposited and physically connected to a protrusion 114' and/or to a layer 504A or 504B. The physical connections to layer 504A or 504B can be made adjacent to a protrusion 114' with or without a physical connection to the protrusion.

In some embodiments individual capacitors 120' taken separately or interconnected into any capacitor circuits (e.g. to provide larger capacitances), and their associated vias 114, are placed across the substrate 104 and within the substrate where smaller capacitances are needed to improve performance. Similarly additional capacitor electrodes, EM shields, and other features made of layers 120D and/or 504 and/or subsequently deposited additional layers can be physically connected to protrusions 114' and/or capacitor electrodes.

Additional dielectric and conductive layers similar to 120D and 504 can be made by the same or similar techniques to provide additional capacitor electrodes or EM shielding or other features wrapping around any one or more protrusions 114' in a similar, sleeve-like manner with the sleeve's thickness being smaller than the sleeve's height. The sleeves of such features may or may not be similarly connected to selected protrusions 114' and/or each other. For example, an additional dielectric layer can be made over the structure similar to 120D, and then an additional conductive layer similar to 504A or 504B can be deposited and physically connected to a protrusion 114' and/or to a layer 504A or 504B. The physical connections to layer 504A or 504B can be made adjacent to a protrusion 114' with or without a physical connection to the protrusion.

In some embodiments, the fabrication sequence is reversed in that the RDL 614 (FIG. 6D) is formed before the substrate 104. More particularly, RDL 614 can be formed on an underlying substrate (not shown) or may itself be replaced by a substrate with circuitry. This substrate 614 may be organic, ceramic, semiconductor, laminated, or any other type used in microelectronics.

Such substrate 614 has contact pads on top. Vias 114 are discrete, free-standing wires bonded to these contact pads or printed on these contact pads or formed on these contact pads by electroplating and/or electroless plating and/or other methods. See e.g. U.S. patent publication no. 2014/0036454 (Caskey et al., Feb. 6, 2014) entitled "BVA Interposer", and U.S. Pat. No. 7,793,414 (Haba et al., Sep. 14, 2010), both incorporated herein by reference.

Then substrate 104 is formed, possibly as a dielectric layer, e.g. dielectric encapsulant (for example an organic molding compound), possibly by molding or spin on, or by some other process, e.g. CVD of an organic or inorganic material. Alternatively, substrate 104 can be formed separately, and vias 114 can be inserted into through-holes in substrate 104; see the aforementioned Haba et al. U.S. Pat. No. 7,793,414. Vias 114 protrude above substrate 104. Dielectric 610 can be formed in advance, before substrate 104 for any desired purpose, e.g. to insulate substrate 104 from vias 114 if substrate 104 is not dielectric. Then fabrication proceeds as described above in connection with FIG. 6D and subsequent figures.

Figure 11C:
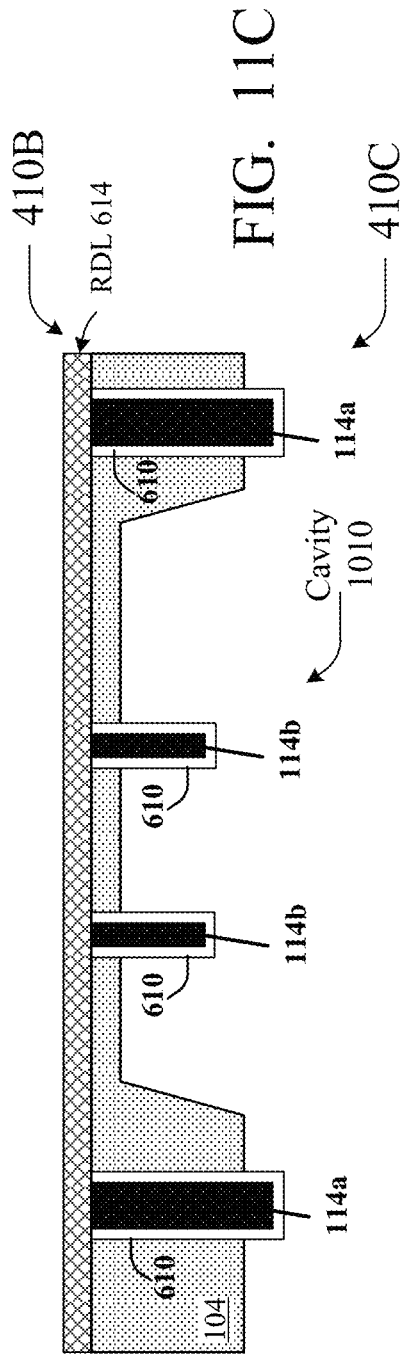

Many process variations are possible. For example, barrier layers can be used to prevent interdiffusion or corrosion or to improve adhesion. Thus, if vias 114 are formed of copper, a barrier layer of nickel (possibly nickel phosphorus or some other nickel alloy) can be deposited over protrusions 114'. In one such process, the barrier layer is deposited (e.g. by PVD) into holes 118 (FIG. 6A) after dielectric 610 as part of vias 114. In another variation, the barrier layer is formed after the stage of Fib. 6C.1: the dielectric 610 is removed from over protrusions 114', and the barrier layer is formed by electroless plating. A plating mask can be used on the capacitor side 410C of substrate 104 as described below in more detail in connection with FIG. 11E.

In the examples above, the drawings showed the substrate 104 as having planar top and bottom surfaces, but this is not necessary. For example, referring to FIG. 8, the rightmost via 114 is not used for a capacitor, and substrate 104 can be thicker near this via in order to mechanically strengthen the structure. A possible process is as follows. First, fabrication proceeds as above to provide the structure of FIG. 6B, i.e. with blind holes 118 and blind vias 114. Then the substrate side 410C is thinned using a masked etch to form a cavity 1010—see FIG. 10A showing an example with four vias 114. The capacitor will be formed around the two middle vias 114b; no capacitor will be formed around vias 114a. (In this figure, the RDL 614 is shown as a single rectangle, without separately showing the RDL's dielectric and interconnect lines). The substrate thinning exposes the dielectric 610 over all vias 114, but the protrusions 114' are longer in cavity 1010 than outside the cavity. In one example of the thinning process, the substrate side 410C is first thinned uniformly, e.g. by a combination of grinding and/or CMP and/or chemical etching, to expose just the tops of dielectric 610 and recede to a level slightly below the top ends of protrusions 114 (by 5 μm in some embodiments). Then a mask is formed (not shown) photolithographically to define the cavity 1010, and the cavity is formed by a masked etch of substrate 104. An exemplary cavity depth depends on the desired height of the capacitor sleeves; e.g. 5 to 500 μm is appropriate in some embodiments in which the substrate 104 is initially a silicon wafer of 300 mm diameter and 650 μm thickness, and the via 114 diameter is 2 to 200 μm. The mask is then removed. The process and dimensions are not limiting. For example, in some embodiments, vias 114a do not protrude out of the substrate, i.e. their top surface is level with, or below the level of, the top surface of substrate 104.

The fabrication then proceeds in any manner described above in connection with FIGS. 6D to 9. For example, FIGS. 10B and 10C shows the structure at the stages of FIGS. 6G and 6I respectively. The resist 620 (FIG. 10B) covers the capacitor sleeve structures inside the cavity 1010 but the resist as absent outside the cavity. Therefore, layers 504A, 120D, 504B are removed outside the cavity. Then dielectric 630 (FIG. 10C) is formed to cover the structure on side 410C, and the structure is planarized (by CMP for example) to expose the tops of vias 114 both inside and outside the cavity. RDL or other features (not shown) can be formed on top such as RDL 640 in FIG. 6J. Other variations described above can be used for the cavity embodiments. Multiple cavities can be formed in the same substrate 104, with separate sets of capacitor sleeves 120' in each cavity. These capacitors can be interconnected as desired; for example, the capacitor layers 504A and 504B can be interconnected as desired inside each cavity (of note, these layers can be patterned by separate masks, not a single mask as in FIG. 10B, as described above for other embodiments). Further, using either the mask 620 of FIG. 10B or the separate masks, the capacitor layers 504 can be interconnected by conductive lines extending between the cavities over the top surface (410C) of substrate 104, and can be connected to the RDL formed on capacitor side 410C. And/or the layers 504 can be connected to selected vias 114 which can be interconnected by lines in RDL 614 or the RDL on side 410C, as described above (see FIG. 9 for example).

In some embodiments, the vias 114 are shorter inside the cavity to protect the dielectric 120D from the planarizing etch of layer 630 or from other processing. In some of these embodiments, layer 504B is omitted; one of the capacitor plates is provided by vias 114 themselves. An exemplary embodiment is as follows. First, holes 118 (FIG. 11A) are formed to have different depths; the deeper holes are shown at 118a, and the shallower holes at 118b. The capacitor sleeves will be made at holes 118b but not 118a. The different depths can be achieved by different etches for each of these hole groups. Alternatively, in some embodiments, a single etch can be used. For example, if substrate 104 is silicon, then a single RIE etch can form both the holes 118a and 118b if holes 118b have a smaller diameter; the smaller-diameter results in smaller depth due to RIE lag.

The holes are filled by vias 114 and optional dielectric 610 (FIG. 11B), and RDL 614 is optionally formed on top, as described above in connection with FIG. 6B. In FIG. 11B, the shorter vias 114 are marked 114b; the longer vias are marked 114a.

Then (FIG. 11C) substrate 104 is thinned selectively to form cavity 1010 around the shorter vias 114b as described above for FIG. 10A. In an exemplary embodiments, substrate 104 is a monocrystalline silicon wafer of 300 mm diameter; each longer via 114a is 30 µm in diameter and 100 µm in height, and each shorter via 114b is 20 µm in diameter and 70 µm in height; the longer vias 114a protrude out of substrate 104 by 50 µm; and the shorter vias 114b protrude by 20 µm. The cavity 1010 is 50 µm deep. The cavity may include an array of hundreds or thousands of vias 114b, and multiple such cavities can be present.

Figure 11D:
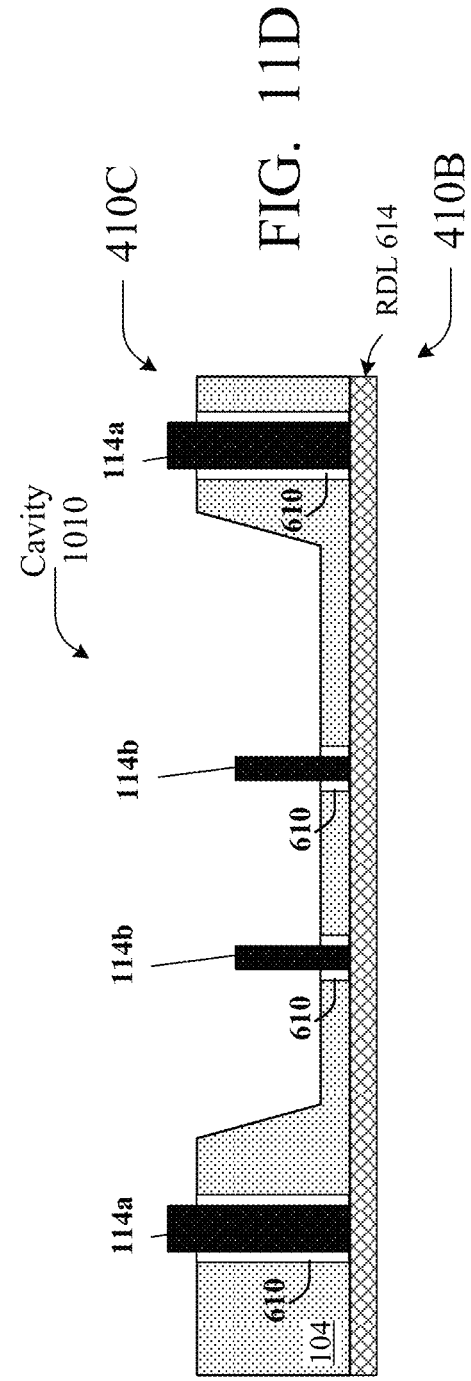

Optionally, a barrier layer is formed over the protrusions of vias 114, e.g. if the vias are made of copper. An exemplary process can be as described above. More particularly, dielectric protrusions 610 are removed from over the vias 114 (FIG. 11D) by a suitable etch, possibly unmasked etch selective to the materials of protrusions 114 and substrate 104. (In some embodiments, the etch leaves dielectric 610 slightly protruding out of the substrate around the vias 114; e.g. a masking layer can be used for this purpose, such as a thin masking layer on substrate 104, deposited without photolithography and removed after the etch.) Then (FIG. 11E) a new masking layer 1110 of photoresist is deposited and patterned to expose the top portions of vias 114b but to entirely cover the structure outside the cavity 1010. Barrier layer 114BA is plated on the exposed portions of protrusions 114b. Mask 1110 does not allow the barrier layer to be shorted to substrate 104 in case the substrate is not dielectric (if the substrate is dielectric or shorting is not a concern, then mask 1110 can be omitted).

Mask 1110 is removed (FIG. 11F), and dielectric 120D is formed as a thin layer over the entire capacitor side 410C by any suitable process as described above. In some embodiments, dielectric 120D is conformal, and its materials and thickness are chosen as described above.

Then (FIG. 11G) conductive layer 504 is selectively deposited to provide capacitor electrode(s). This can be done by any suitable process described above for layers 504, 504A, 504B. An exemplary process is a lift-off process with PVD of layer 504 (e.g. copper). Layer 504 is shown as extending continuously over multiple vias 114b (similar to FIG. 5A), but layer 504 can be patterned into unconnected portions each of which extends over one or more but not all of vias 114b so that different vias 114b will correspond to different capacitors possibly unconnected to each other. Each via 114b will provide a capacitor plate connected to outside circuitry by RDL 614; multiple vias 114b can be interconnected by the RDL to provide larger capacitances.

Then (FIG. 11H) dielectric 630 is deposited on the capacitor side 410C and patterned to espose the non-capacitor vias 114a and the conductor 504 over vias 114b. In the example shown, a damascene process is used; in other words, holes are made through dielectric layer 630 over vias 114b to expose the conductor 504; also, holes are made through dielectric 630 and 120D over vias 114a to expose these vias; the holes are filled with conductor 1120 (e.g. metal, possibly copper or a combination of metal layers). The holes through dielectric 630 can be made by an etch which also forms trenches (not shown) between the holes in dielectric 630 (the trenches do not go through the dielectric), and conductor 1120 will fill these trenches to interconnect selected vias 114a and/or conductor portions 504. Conductor 1120 can thus provide a first interconnect level for an RDL on side 410C such as RDL 640 in FIG. 6J. The RDL fabrication or other processing can proceed as in the previously described embodiments.

Some of vias 114b may be unused for capacitors but are provided to improve heat conductivity and hence heat dissipation and removal, and/or for mechanical strength.

Figure 12A:
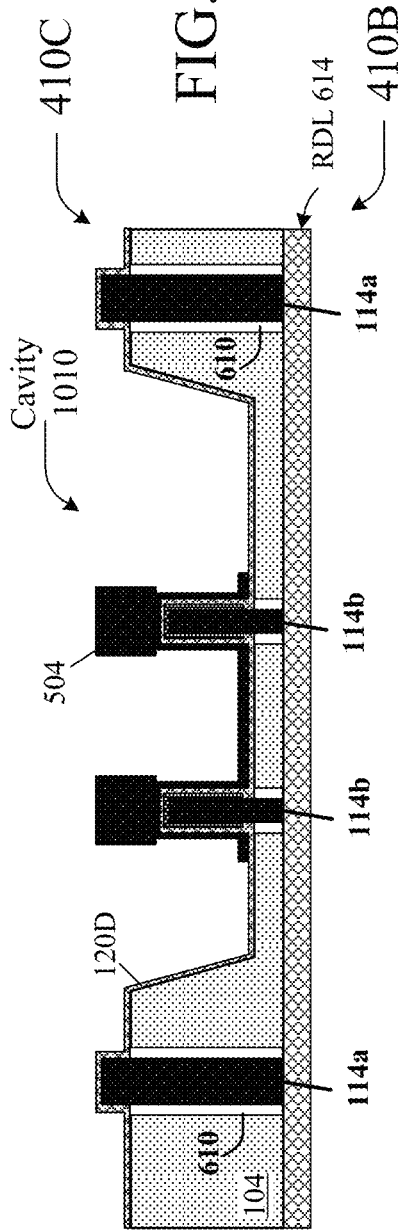
Figure 12B:
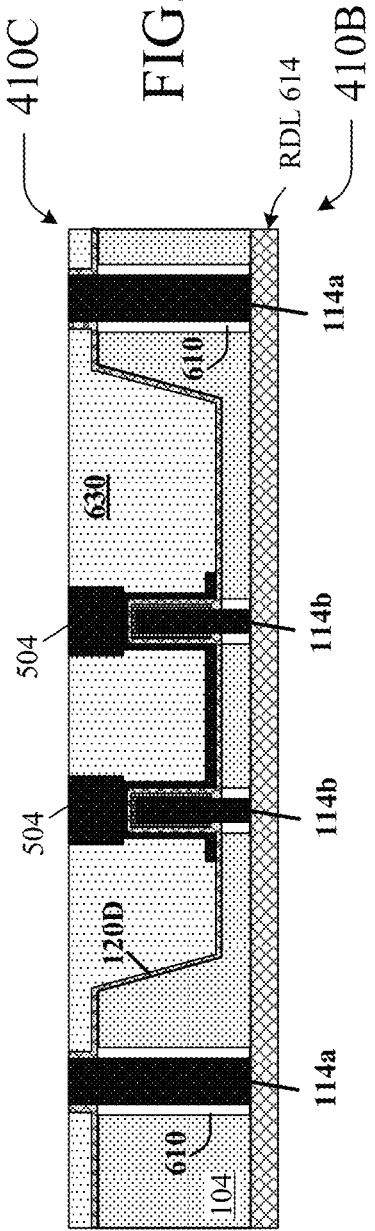

The invention is not limited to the embodiments described above. For example, processes, materials, and dimensions described for some embodiments can be used in other embodiments. Thus, the damascene process of FIG. 11H can be used in forming the RDL 640 of FIG. 6J and of other embodiments. Conversely, planarization of dielectric 630, metal 504, and dielectric layers 120D/618/610 of FIG. 6I or 10C can be used with variations of the process of FIG. 11H. One example is illustrated in FIGS. 12A and 12B showing respectively the processing stages similar to FIG. 11G (conductor 504 deposition) and 11H (dielectric 630 deposition). More particularly, as shown in FIG. 12A, the conductor 504 is formed non-conformally to have large protrusions on top of vias 114b. For example, if conductor 504 is copper, nickel, or some other metal, the metal protrusions can be formed for example by adjusting the plating conditions such as current density and plating bath chemistry. Thus, in some embodiments, additive-free chemistry may be suitable. In particular, it is known that, generally speaking, non-conformal plating can occur at protrusions of the underlying surface (such as protrusions 114) due to higher electric fields at the protrusions. Generally, when conformal plating is desired, the plating rate at the protrusions can be reduced by leveler additives in the plating bath; such additives have polar molecules disproportionately attracted to the protrusions by high electric fields to slow down the plating rate at the protrusions. For non-conformal plating, levelers can be omitted or reduced in content. The resulting protrusions of metal 504 in the cavity can rise above the level of dielectric 120D outside the cavity. Therefore, a blanket planarizing removal (e.g. by CMP) of dielectric 630 and 120D to expose the vias 114a (as in FIG. 10C) will also expose the metal 504 over vias 114b. Vias 114a and conductor 504 can be slightly polished in this process.

Other process variations can be present. The capacitor plates made of layers 504 described above in connection with FIGS. 10C through 12B form sleeves which may be circular in top view as in FIG. 5B or non-circular. The sleeves may extend to cover the protrusions 114 as in FIG. 11H or 12B.

There can be additional conductive vias that go through the substrate but do not protrude above the substrate. Such vias can be formed at the same time as the protruding vias, or before or after the protruding vias, for example by etching additional, shallow holes 118 (not shown) and filling them with conductor at the stage of FIG. 6A, and then exposing them at the capacitor side 410C at the stage of FIG. 6C.1 so that they do not protrude out of the substrate on the capacitor side, and forming conductive lines connecting such conductive vias to circuit elements above and/or below the substrate (e.g. including the lines of RDL 614 or lines made of layer 504A and/or 504B to connect such vias to protrusions 114' and/or layers 504A and 504B and/or to lines of RDL 640). The invention is not limited by any processes or dimensions. Some embodiments are defined by the following clauses.

Clause 1 defines a microelectronic component comprising:

a substrate comprising a top surface, a bottom surface, and one or more first through-holes each of which passes between the top surface and the bottom surface;

one or more conductive vias (e.g. 114) protruding from the one or more first through-holes to form at each first through-hole a conductive protrusion above the substrate;

for each conductive protrusion protruding from a corresponding first through-hole, a first conductive sleeve region (e.g. capacitor electrode 120E.A being like a sleeve around the protrusion 114', or just part of the electrode 120E.A) wrapping around the conductive protrusion and extending at least along a segment of the conductive protrusion, the first conductive sleeve region being electrically insulated from a top surface of the first through-hole (not descending into the through-hole in contrast to FIG. 3), the first conductive sleeve region comprising an inner surface facing the conductive protrusion, an outer surface opposite to the inner surface, and a thickness which is a distance between the inner and outer surfaces, a maximum value of the thickness being smaller than a length of the inner surface measured along the segment (e.g. the thickness of 120E.A can be smaller than its height).

Clause 2 defines the microelectronic component of clause 1 wherein for each conductive protrusion, the first conductive sleeve region is laterally spaced from the first through-hole towards outside of the first through-hole.

Clause 3 defines the microelectronic component of clause 1 or 2 wherein the substrate further comprises one or more second through-holes each of which passes between the top surface and the bottom surface; and the microelectronic component further comprises:

one or more conductive vias protruding from the one or more second through-holes to form at each second through-hole a conductive protrusion above the substrate;

for each conductive protrusion protruding from a corresponding second through-hole, a conductive feature electrically interconnecting the conductive protrusion and at least one first conductive sleeve region.

Clause 4 defines the microelectronic component of clause 1, 2 or 3 wherein the substrate comprises a cavity in the top surface, each conductive protrusion is at least partially located in the cavity;

the substrate further comprises one or more second through-holes each of which passes between the top surface and the bottom surface outside the cavity; and the microelectronic component further comprises one or more conductive vias each of which passes through a corresponding second through-hole and is electrically coupled to a circuit element above the substrate and a circuit element below the substrate.

Clause 5 defines the microelectronic component of any preceding clause further comprising, for each conductive protrusion, a corresponding second conductive sleeve region extending at least along said segment of the conductive protrusion and wrapping around the first conductive sleeve region, the second conductive sleeve region being separated from the first conductive sleeve region by dielectric.

Of note, clause 5 includes embodiments with additional through-holes and conductive vias protruding or not protruding from the additional through-holes, possibly protruding from such additional through-holes but having only a first sleeve region but not a second sleeve region.

Clause 6 defines the microelectronic component of clause 5 comprising:

a first conductive layer comprising each first conductive sleeve region;

a second conductive layer comprising each second conductive sleeve region and electrically insulated from the first conductive layer;

a dielectric film insulating the first conductive layer from the second conductive layer; (the film may physically contact the first and second conductive layers and have smaller thickness than at least one dimension of the film's surface contacting the first conductive layer and than at least one dimension of the film's surface contacting the second conductive layer);

wherein the first conductive layer covers the top surface of the substrate except for any area underlying any area surrounded by any first conductive sleeve region; and wherein the second conductive layer covers the top surface of the substrate except for any area underlying any area surrounded by any second conductive sleeve region.

Clause 7 defines the microelectronic component of clause 5 comprising a capacitor having a first electrode and a second electrode which comprise, respectively, at least one first conductive sleeve region and the corresponding second conductive sleeve region, the first and second electrodes being accessible for electrical contact from another component.

Clause 8 defines the microelectronic component of clause 7 wherein the microelectronic component is configured to operate with the first electrode receiving a first reference voltage and with the second electrode receiving a second reference voltage different from the first reference voltage.

Clause 9 defines the microelectronic component of clause 8 wherein one of the first and second reference voltages is a power supply voltage, and the other one of the first and second reference voltages is a ground voltage.

Clause 10 defines the microelectronic component of any preceding clause wherein the microelectronic component is configured to operate with the first electrode receiving a constant voltage.

Clause 11 defines the microelectronic component of any preceding clause comprising a conductive layer comprising each first conductive sleeve region;

wherein the conductive layer covers the top surface of the substrate except for any area underlying any area surrounded by any first conductive sleeve region.

Clause 12 defines the microelectronic component of any preceding clause wherein each conductive via passes through the corresponding first through-hole and provides a conductive path between a circuit element below the substrate and a circuit element above the substrate.

Clause 13 defines a microelectronic component comprising:

a substrate comprising a top surface, a bottom surface, and one or more first through-holes each of which passes between the top surface and the bottom surface;

one or more conductive vias protruding from the one or more first through-holes to form at each first through-hole a conductive protrusion above the substrate;

for each conductive protrusion protruding from a corresponding first through-hole the microelectronic component comprises:
a first conductive sleeve region wrapping around the conductive protrusion and extending at least along a segment of the conductive protrusion, the first conductive sleeve region being electrically insulated from a top surface of the first through-hole; and
a second conductive sleeve region extending at least along said segment of the conductive protrusion and wrapping around the first conductive sleeve region, the second conductive sleeve region being separated from the first conductive sleeve region by dielectric.

Clause 14 defines the microelectronic component of clause 13 wherein for each conductive protrusion, the first conductive sleeve region is laterally spaced from the first through-hole towards outside of the first through-hole.

Clause 15 defines the microelectronic component of clause 13 or 14 wherein the substrate further comprises one or more second through-holes each of which passes between the top surface and the bottom surface; and
the microelectronic component further comprises:
one or more conductive vias protruding from the one or more second through-holes to form at each second through-hole a conductive protrusion above the substrate;
for each conductive protrusion protruding from a corresponding second through-hole, a conductive feature electrically interconnecting the conductive protrusion and at least one first conductive sleeve region or at least one second conductive sleeve region.

Clause 16 defines the microelectronic component of clause 13, 14 or 15 wherein the substrate comprises a cavity in the top surface, each conductive protrusion is at least partially located in the cavity;
the substrate further comprises one or more second through-holes each of which passes between the top surface and the bottom surface outside the cavity; and
the microelectronic component further comprises one or more conductive vias each of which passes through a corresponding second through-hole and is electrically coupled to a circuit element above the substrate and a circuit element below the substrate.

Clause 17 defines the microelectronic component of clause 13, 14, 15 or 16 comprising:
a first conductive layer comprising each first conductive sleeve region;
a second conductive layer comprising each second conductive sleeve region and electrically insulated from the first conductive layer;
a dielectric film insulating the first conductive layer from the second conductive layer;
wherein the first conductive layer covers the top surface of the substrate except for any area underlying any area surrounded by any first conductive sleeve region; and
wherein the second conductive layer covers the top surface of the substrate except for any area underlying any area surrounded by any second conductive sleeve region.

Clause 18 defines the microelectronic component of clause 13, 14, 15, 16, or 17 comprising a capacitor having a first electrode and a second electrode which comprise, respectively, at least one first conductive sleeve region and the corresponding second conductive sleeve region, the first and second electrodes being accessible for electrical contact from another component.

Clause 19 defines the microelectronic component of clause 18 wherein the microelectronic component is configured to operate with the first electrode receiving a first reference voltage and with the second electrode receiving a second reference voltage different from the first reference voltage.

Clause 20 defines the microelectronic component of clause 19 wherein one of the first and second reference voltages is a power supply voltage, and the other one of the first and second reference voltages is a ground voltage.

Clause 21 defines the microelectronic component of clause 18 wherein at least one conductive via passes through the corresponding first through-hole and is connected to a contact pad located below the substrate.

Clause 22 defines the microelectronic component of clause 13, 14, 15, 16, 17, 18, 19, 20, or 21 wherein the microelectronic component is configured to operate with the first electrode receiving a constant voltage.

Clause 23 defines the microelectronic component of any one of clauses 13-22 wherein each conductive via passes through the corresponding first through-hole and provides a conductive path between a circuit element below the substrate and a circuit element above the substrate.

Clause 24 defines a manufacturing method comprising:
providing a structure comprising:
a substrate comprising a top surface, a bottom surface, and one or more first through-holes each of which passes between the top surface and the bottom surface;
one or more conductive vias protruding from the one or more first through-holes to form at each first through-hole a conductive protrusion above the substrate;
after providing the structure, forming over the substrate, for each conductive protrusion protruding from a corresponding first through-hole, a first conductive sleeve region wrapping around the conductive protrusion and extending at least along a segment of the conductive protrusion, the first conductive sleeve region being electrically insulated from a top surface of the first through-hole, the first conductive sleeve region comprising an inner surface facing the conductive protrusion, an outer surface opposite to the inner surface, and a thickness which is a distance between the inner and outer surfaces, a maximum value of the thickness being smaller than a length of the inner surface measured along the segment.

Clause 25 defines the method of clause 24 wherein for each conductive protrusion, the first conductive sleeve region is laterally spaced from the first through-hole towards outside of the first through-hole.

Clause 26 defines the method of clause 24 or 25 wherein the substrate further comprises one or more second through-holes each of which passes between the top surface and the bottom surface; and
the structure further comprises one or more conductive vias protruding from the one or more second through-holes to form at each second through-hole a conductive protrusion above the substrate; and
the method further comprises, after providing the structure, forming over the substrate, for each conductive protrusion protruding from a corresponding second through-hole, a conductive feature electrically interconnecting the conductive protrusion and at least one first conductive sleeve region.

Clause 27 defines the method of any one of clauses 24-26 further comprising, after forming the structure, forming over the substrate, for each conductive protrusion, a corresponding second conductive sleeve region extending at least along said segment of the conductive protrusion and wrapping around the first conductive sleeve region, the second conductive sleeve region being separated from the first conductive sleeve region by a dielectric film.

Clause 28 defines the method of clause 27 wherein:
forming each first conductive sleeve region comprises forming a first conductive layer comprising each first conductive sleeve region;
forming each second conductive sleeve region comprises forming a second conductive layer comprising each second conductive sleeve region and electrically insulated from the first conductive layer;
wherein the dielectric film insulates the first conductive layer from the second conductive layer;
wherein the first conductive layer covers the top surface of the substrate except for any area underlying any area surrounded by any first conductive sleeve region; and
wherein the second conductive layer covers the top surface of the substrate except for any area underlying any area surrounded by any second conductive sleeve region.

Clause 29 defines the method of clause 27 comprising forming a capacitor having a first electrode and a second electrode which comprise, respectively, at least one first conductive sleeve region and the corresponding second conductive sleeve region, the first and second electrodes being accessible for electrical contact from another component.

Clause 30 defines the method of clause 29 wherein the method provides a microelectronic component configured to operate with the first electrode receiving a first reference voltage and with the second electrode receiving a second reference voltage different from the first reference voltage.

Clause 31 defines the method of clause 30 wherein one of the first and second reference voltages is a power supply voltage, and the other one of the first and second reference voltages is a ground voltage.

Clause 32 defines the method of any one of clauses 24-31 wherein the method provides a microelectronic component configured to operate with the first electrode receiving a constant voltage.

Clause 33 defines the method of any one of clauses 24-32 wherein forming each first conductive sleeve region comprises forming a conductive layer comprising each first conductive sleeve region;
wherein the conductive layer covers the top surface of the substrate except for any area underlying any area surrounded by any first conductive sleeve region.

Clause 34 defines the method of any one of clauses 24-33 wherein each first conductive via passes through the corresponding through-hole and provides a conductive path between a circuit element below the substrate and a circuit element above the substrate.

The invention is not limited to the embodiments described above. Other embodiments and variations are within the scope of the invention, as defined by the appended claims.

The invention claimed is:

1. A microelectronic component comprising:
a substrate comprising a top surface, a bottom surface, and one or more first through-holes, each first through-hole passing between the top surface and the bottom surface;
one or more conductive vias protruding from the one or more first through-holes to form at each first through-hole a conductive protrusion above the substrate;
for each conductive protrusion protruding from a corresponding first through-hole, a first conductive sleeve region wrapping around the conductive protrusion and extending at least along a segment of the conductive protrusion, the first conductive sleeve region being electrically insulated from any conductive protrusion protruding from the first through-hole above the substrate, the first conductive sleeve region comprising an inner surface facing the conductive protrusion, an outer surface opposite to the inner surface, and a thickness which is a distance between the inner and outer surfaces, a maximum value of the thickness being smaller than a length of the inner surface measured along the segment.

2. The microelectronic component of claim 1 wherein for each conductive protrusion, the first conductive sleeve region is laterally spaced from the first through-hole towards outside of the first through-hole.

3. The microelectronic component of claim 1 wherein the substrate further comprises one or more second through-holes each of which passes between the top surface and the bottom surface; and
the microelectronic component further comprises:
one or more conductive vias protruding from the one or more second through-holes to form at each second through-hole a conductive protrusion above the substrate;
for each conductive protrusion protruding from a corresponding second through-hole, a conductive feature electrically interconnecting the conductive protrusion and at least one first conductive sleeve region.

4. The microelectronic component of claim 1 wherein the substrate comprises a cavity in the top surface, each conductive protrusion is at least partially located in the cavity;
the substrate further comprises one or more second through-holes, each second through-hole passing between the top surface and the bottom surface outside the cavity; and
the microelectronic component further comprises one or more conductive vias each of which passes through a corresponding second through-hole and is electrically coupled to a circuit element above the substrate and a circuit element below the substrate.

5. The microelectronic component of claim 1 further comprising, for each conductive protrusion, a corresponding second conductive sleeve region extending at least along said segment of the conductive protrusion and wrapping around the first conductive sleeve region, the second conductive sleeve region being separated from the first conductive sleeve region by a dielectric film.

6. The microelectronic component of claim 1 comprising a conductive layer comprising each first conductive sleeve region;
wherein the conductive layer covers the top surface of the substrate except for any area underlying any area surrounded by any first conductive sleeve region.

7. The microelectronic component of claim 1 wherein each conductive via passes through the corresponding first through-hole and provides a conductive path between a circuit element below the substrate and a circuit element above the substrate.

8. A microelectronic component comprising:
a substrate comprising a top surface, a bottom surface, and one or more first through-holes, each first through-hole passing between the top surface and the bottom surface;
one or more first conductive vias protruding from the one or more first through-holes to form at each first through-hole a conductive protrusion above the substrate;
for each conductive protrusion protruding from a corresponding first through-hole the microelectronic component comprises:
a first conductive sleeve region wrapping around the conductive protrusion and extending at least along a segment of the conductive protrusion, the first conductive sleeve region being electrically insulated from any conductive protrusion protruding from the first through-hole above the substrate; and a second conductive sleeve region extending at least along said segment of the conductive protrusion and wrapping around the first conductive sleeve region, the second conductive sleeve region being separated from the first conductive sleeve region by a dielectric film.

9. The microelectronic component of claim 8 wherein for each conductive protrusion, the first conductive sleeve region is laterally spaced from the first through-hole towards outside of the first through-hole.

10. The microelectronic component of claim 8 wherein the substrate further comprises one or more second through-holes, each second through-hole passing between the top surface and the bottom surface; and the microelectronic component further comprises:
one or more conductive vias protruding from the one or more second through-holes to form at each second through-hole a conductive protrusion above the substrate;
for each conductive protrusion protruding from a corresponding second through-hole, a conductive feature electrically interconnecting the conductive protrusion and at least one first conductive sleeve region or at least one second conductive sleeve region.

11. The microelectronic component of claim 8 wherein the substrate comprises a cavity in the top surface, each conductive protrusion is at least partially located in the cavity;
the substrate further comprises one or more second through-holes, each second through-hole passing between the top surface and the bottom surface outside the cavity; and
the microelectronic component further comprises one or more second conductive vias, each second conductive via passing through a corresponding second through-hole and is electrically coupled to a circuit element above the substrate and a circuit element below the substrate.

12. The microelectronic component of claim 8 comprising:
a first conductive layer comprising each first conductive sleeve region;
a second conductive layer comprising each second conductive sleeve region and electrically insulated from the first conductive layer;
a dielectric film insulating the first conductive layer from the second conductive layer;
wherein the first conductive layer covers the top surface of the substrate except for any area underlying any area surrounded by any first conductive sleeve region; and
wherein the second conductive layer covers the top surface of the substrate except for any area underlying any area surrounded by any second conductive sleeve region.

13. The microelectronic component of claim 8 comprising a capacitor having a first electrode and a second electrode which comprise, respectively, at least one first conductive sleeve region and the corresponding second conductive sleeve region, the first and second electrodes being accessible for electrical contact from another component.

14. The microelectronic component of claim 8 wherein each first conductive via passes through the corresponding first through-hole and provides a conductive path between a circuit element below the substrate and a circuit element above the substrate.

15. A manufacturing method comprising:
providing a structure comprising:
a substrate comprising a top surface, a bottom surface, and one or more first through-holes each of which passes between the top surface and the bottom surface;
one or more conductive vias protruding from the one or more first through-holes to form at each first through-hole a conductive protrusion above the substrate;
after providing the structure, forming over the substrate, for each conductive protrusion protruding from a corresponding first through-hole, a first conductive sleeve region wrapping around the conductive protrusion and extending at least along a segment of the conductive protrusion, the first conductive sleeve region being electrically insulated from any conductive protrusion protruding from the first through-hole above the substrate, the first conductive sleeve region comprising an inner surface facing the conductive protrusion, an outer surface opposite to the inner surface, and a thickness which is a distance between the inner and outer surfaces, a maximum value of the thickness being smaller than a length of the inner surface measured along the segment.

16. The method of claim 15 wherein for each conductive protrusion, the first conductive sleeve region is laterally spaced from the first through-hole towards outside of the first through-hole.

17. The method of claim 15 wherein the substrate further comprises one or more second through-holes each second through-hole passing between the top surface and the bottom surface; and
the structure further comprises one or more conductive vias protruding from the one or more second through-holes to form at each second through-hole a conductive protrusion above the substrate; and
the method further comprises, after providing the structure, forming over the substrate, for each conductive protrusion protruding from a corresponding second through-hole, a conductive feature electrically interconnecting the conductive protrusion and at least one first conductive sleeve region.

18. The method of claim 15 further comprising, after providing the structure, forming over the substrate, for each conductive protrusion, a corresponding second conductive sleeve region extending at least along said segment of the conductive protrusion and wrapping around the first conductive sleeve region, the second conductive sleeve region being separated from the first conductive sleeve region by a dielectric film.

19. The method of claim 18 wherein:
forming each first conductive sleeve region comprises forming a first conductive layer comprising each first conductive sleeve region;
forming each second conductive sleeve region comprises forming a second conductive layer comprising each second conductive sleeve region and electrically insulated from the first conductive layer;
wherein the dielectric film insulates the first conductive layer from the second conductive layer;
wherein the first conductive layer covers the top surface of the substrate except for any area underlying any area surrounded by any first conductive sleeve region; and
wherein the second conductive layer covers the top surface of the substrate except for any area underlying any area surrounded by any second conductive sleeve region.

20. The method of claim 18 comprising forming a capacitor having a first electrode and a second electrode which comprise, respectively, at least one first conductive sleeve region and the corresponding second conductive sleeve region, the first and second electrodes being accessible for electrical contact from another component.

21. A microelectronic component comprising:
a substrate comprising a top surface, a bottom surface, and one or more first through-holes, each first through-hole passing between the top surface and the bottom surface;
one or more conductive vias protruding from the one or more first through-holes to form at each first through-hole a conductive protrusion above the substrate;
for each conductive protrusion protruding from a corresponding first through-hole, a conductive feature comprising a first conductive sleeve region wrapping around the conductive protrusion and extending at least along a segment of the conductive protrusion, the first conductive sleeve region being electrically insulated from the conductive protrusion, the conductive feature comprising a lateral extension extending away from the conductive protrusion at a bottom of the first conductive sleeve region.

22. The microelectronic component of claim 21 wherein the substrate comprises a cavity in the top surface, each conductive protrusion is at least partially located in the cavity;
the substrate further comprises one or more second through-holes, each of which passes between the top surface and the bottom surface outside the cavity; and
the microelectronic component further comprises one or more conductive vias, each of which passes through a corresponding second through-hole and is electrically coupled to a circuit element above the substrate and a circuit element below the substrate.

23. The microelectronic component of claim 1 further comprising, for each conductive protrusion, a corresponding second conductive sleeve region extending at least along said segment of the conductive protrusion and wrapping around the first conductive sleeve region, the second conductive sleeve region being separated from the first conductive sleeve region by a dielectric film.

24. The microelectronic component of claim 21 comprising a conductive layer comprising each first conductive sleeve region;
wherein the conductive layer covers the top surface of the substrate except for any area underlying any area surrounded by any first conductive sleeve region.

25. The microelectronic component of claim 21 wherein each lateral extension laterally surrounds the corresponding conductive protrusion.

\* \* \* \* \*